United States Patent
Horn et al.

(10) Patent No.: US 12,028,087 B2
(45) Date of Patent: Jul. 2, 2024

(54) DYNAMIC ANALOG-TO-DIGITAL CONVERTER CAPABILITY

(71) Applicant: QUALCOMM Incorporated, San Diego, CA (US)

(72) Inventors: Idan Michael Horn, Hod Hasharon (IL); Shay Landis, Hod Hasharon (IL); Assaf Touboul, Netanya (IL); Amit Bar-Or Tillinger, Tel-Aviv (IL)

(73) Assignee: QUALCOMM Incorporated, San Diego, CA (US)

( * ) Notice: Subject to any disclaimer, the term of this patent is extended or adjusted under 35 U.S.C. 154(b) by 56 days.

(21) Appl. No.: 17/124,159

(22) Filed: Dec. 16, 2020

(65) Prior Publication Data
US 2022/0190837 A1    Jun. 16, 2022

(51) Int. Cl.
*H03M 1/20*    (2006.01)
*H04W 52/02*    (2009.01)
*H04W 76/10*    (2018.01)

(52) U.S. Cl.
CPC ......... *H03M 1/20* (2013.01); *H04W 52/0229* (2013.01); *H04W 76/10* (2018.02)

(58) Field of Classification Search
CPC ............. H04W 52/0229; H04W 76/10; H04W 52/0212; H03M 1/20; H03M 1/007; Y02D 30/70
See application file for complete search history.

(56) References Cited

U.S. PATENT DOCUMENTS

| | | | |
|---|---|---|---|
| 7,205,923 B1 * | 4/2007 | Bahai | H03M 1/007 341/161 |
| 10,701,638 B2 | 6/2020 | Lee et al. | |
| 2006/0184363 A1 * | 8/2006 | McCree | G10L 21/0208 704/233 |
| 2016/0302092 A1 * | 10/2016 | Sartori | H04L 5/0064 |
| 2020/0068492 A1 * | 2/2020 | Lee | H04W 52/0261 |
| 2020/0160376 A1 * | 5/2020 | Esayian | G06Q 30/0269 |
| 2020/0260376 A1 * | 8/2020 | Islam | H04W 52/0212 |
| 2021/0135716 A1 * | 5/2021 | Kuo | H04B 7/0617 |

OTHER PUBLICATIONS

International Search Report and Written Opinion—PCT/US2021/060284—ISA/EPO—dated Mar. 11, 2022 (207392WO).

* cited by examiner

*Primary Examiner* — Marcos L Torres
(74) *Attorney, Agent, or Firm* — QUALCOMM Incorporated

(57) ABSTRACT

Methods, systems, and devices for wireless communication are described for one or more aspects of dynamically configuring an analog-to-digital converter (ADC). A user equipment (UE) may determine a set of supported ADC resolution sizes including one or more dynamically configurable bit quantities. The UE may transmit a capability message including an indication of the set of ADC resolution sizes to a base station. The UE may indicate, to the base station, a power consumption factor or a table of signal-to-quantization noise ratios (SQNR) per bit quantity supported by the UE's ADC. In some cases, the base station may enable, based on the set of ADC resolution sizes, clipping of a power amplifier and one or more associated precoding parameters, and may indicate the precoding parameters to the UE. The UE may select an ADC resolution size for processing received messages.

24 Claims, 15 Drawing Sheets

DYNAMIC ANALOG-TO-DIGITAL CONVERTER CAPABILITY

FIELD OF TECHNOLOGY

The following relates to wireless communication, including dynamic analog-to-digital converter capability.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

A UE may process a signal received from another devices (such as another UE or base station) using an analog-to-digital converter (ADC). In some cases, power consumption at the UE may be affected by a sampling frequency and a resolution of the ADC. As some systems may operate in relatively higher carrier frequencies, and correspondingly increased sampling frequencies, a UE may be affected by increased power consumption when receiving and processing signals at higher frequencies.

SUMMARY

The described techniques relate to improved methods, systems, devices, and apparatuses that support a dynamic analog-to-digital converter (ADC) capability. Generally, the described techniques support a first wireless device (e.g., a user equipment (UE)) transmitting a capability message that includes an indication of a set of ADC resolution sizes supported by the first wireless device, which may be transmitted to a second wireless device (e.g., a base station, a gNB, or the like). The UE may transmit the capability message within a control message (e.g., a radio resource control (RRC) message). The capability message may include one or more of an indication of a capability of the UE to reconfigure an ADC resolution, a set of supported ADC resolution sizes (e.g., including two or more bit quantities corresponding to supported ADC resolutions), a table of signal-to-quantization noise ratio (SQNR) values per ADC resolution size, or any combination thereof, among other examples. The set of supported ADC resolution sizes may be reported as integer values or as positive real numbers, and each ADC resolution size of the set of ADC resolution sizes may represent an effective number of bits (ENOB) of the UE's ADC. A receiving base station (e.g., a gNB) may use the received capability message to optimize communications based on the indicated UE ADC resolution. For example, the base station may use the indicated ADC capability to allow clipping of a power amplifier for a transmitted signal, where the signal may be efficiently reconstructed by the UE based on the UE's dynamic ADC resolution size.

A method is described. The method may include performing a connection establishment procedure with a second wireless device, identifying, based on performing the connection establishment procedure, a set of ADC resolution sizes supported by the first wireless device, the set of ADC resolution sizes including two or more bit quantities that are dynamically configurable by the first wireless device, and transmitting, to the second wireless device, a capability message that includes an indication of the set of ADC resolution sizes supported by the first wireless device.

An apparatus is described. The apparatus may include a processor, memory in electronic communication with the processor, and instructions stored in the memory. The instructions may be executable by the processor to cause the apparatus to perform a connection establishment procedure with a second wireless device, identify, based on performing the connection establishment procedure, a set of ADC resolution sizes supported by the first wireless device, the set of ADC resolution sizes including two or more bit quantities that are dynamically configurable by the first wireless device, and transmit, to the second wireless device, a capability message that includes an indication of the set of ADC resolution sizes supported by the first wireless device.

Another apparatus is described. The apparatus may include means for performing a connection establishment procedure with a second wireless device, means for identifying, based on performing the connection establishment procedure, a set of ADC resolution sizes supported by the first wireless device, the set of ADC resolution sizes including two or more bit quantities that are dynamically configurable by the first wireless device, and means for transmitting, to the second wireless device, a capability message that includes an indication of the set of ADC resolution sizes supported by the first wireless device.

A non-transitory computer-readable medium storing code is described. The code may include instructions executable by a processor to perform a connection establishment procedure with a second wireless device, identify, based on performing the connection establishment procedure, a set of ADC resolution sizes supported by the first wireless device, the set of ADC resolution sizes including two or more bit quantities that are dynamically configurable by the first wireless device, and transmit, to the second wireless device, a capability message that includes an indication of the set of ADC resolution sizes supported by the first wireless device.

Some examples of the method, apparatuses, and non-transitory computer-readable medium described herein may further include operations, features, means, or instructions for generating a table indicating a signal-to-quantization noise ratio (SQNR) per bit quantity supported by the first wireless device based on the set of ADC resolution sizes and transmitting an indication of the table as part of the capability message.

Some examples of the method, apparatuses, and non-transitory computer-readable medium described herein may further include operations, features, means, or instructions for transmitting, to the second wireless device, an indication of a power consumption factor associated with each ADC resolution size of the set of ADC resolution sizes.

In some examples of the method, apparatuses, and non-transitory computer-readable medium described herein, identifying the set of ADC resolution sizes may include operations, features, means, or instructions for identifying an integer value corresponding to each bit quantity of the two or more bit quantities, where the capability message includes an indication of the integer values.

In some examples of the method, apparatuses, and non-transitory computer-readable medium described herein, identifying the set of ADC resolution sizes may include operations, features, means, or instructions for identifying a positive real number corresponding to each bit quantity of the two or more bit quantities, where the capability message includes an indication of the positive real numbers.

In some examples of the method, apparatuses, and non-transitory computer-readable medium described herein, each ADC resolution size of the set of ADC resolution sizes indicates an ENOB for an ADC resolution.

Some examples of the method, apparatuses, and non-transitory computer-readable medium described herein may further include operations, features, means, or instructions for receiving, from the second wireless device, a message indicating one or more precoding parameters that may be based on the set of ADC resolution sizes supported by the first wireless device and processing a received message based on the one or more precoding parameters.

Some examples of the method, apparatuses, and non-transitory computer-readable medium described herein may further include operations, features, means, or instructions for receiving one or more messages from the second wireless device and selecting an ADC resolution size from the set of ADC resolution sizes for processing the one or more messages.

Some examples of the method, apparatuses, and non-transitory computer-readable medium described herein may further include operations, features, means, or instructions for processing the one or more messages using a noise suppression procedure based on the selected ADC resolution. In some examples of the method, apparatuses, and non-transitory computer-readable medium described herein, the noise suppression procedure includes a non-uniform quantization procedure, a nonlinear distortion suppression procedure, a signal reconstruction procedure, or any combination thereof.

In some examples of the method, apparatuses, and non-transitory computer-readable medium described herein, the first wireless device includes a UE and the second wireless device includes a base station.

A method for wireless communication at a first wireless device is described. The method may include performing a connection establishment procedure with a second wireless device, receiving, from the second wireless device and based on the connection establishment procedure, a capability message that includes an indication of a set of ADC resolution sizes supported by the second wireless device, the set of ADC resolution sizes including two or more bit quantities that are dynamically configurable by the second wireless device, and communicating with the second wireless device based on the set of ADC resolution sizes supported by the second wireless device.

An apparatus for wireless communication at a first wireless device is described. The apparatus may include a processor, memory in electronic communication with the processor, and instructions stored in the memory. The instructions may be executable by the processor to cause the apparatus to perform a connection establishment procedure with a second wireless device, receive, from the second wireless device and based on the connection establishment procedure, a capability message that includes an indication of a set of ADC resolution sizes supported by the second wireless device, the set of ADC resolution sizes including two or more bit quantities that are dynamically configurable by the second wireless device, and communicate with the second wireless device based on the set of ADC resolution sizes supported by the second wireless device.

Another apparatus for wireless communication at a first wireless device is described. The apparatus may include means for performing a connection establishment procedure with a second wireless device, means for receiving, from the second wireless device and based on the connection establishment procedure, a capability message that includes an indication of a set of ADC resolution sizes supported by the second wireless device, the set of ADC resolution sizes including two or more bit quantities that are dynamically configurable by the second wireless device, and means for communicating with the second wireless device based on the set of ADC resolution sizes supported by the second wireless device.

A non-transitory computer-readable medium storing code for wireless communication at a first wireless device is described. The code may include instructions executable by a processor to perform a connection establishment procedure with a second wireless device, receive, from the second wireless device and based on the connection establishment procedure, a capability message that includes an indication of a set of ADC resolution sizes supported by the second wireless device, the set of ADC resolution sizes including two or more bit quantities that are dynamically configurable by the second wireless device, and communicate with the second wireless device based on the set of ADC resolution sizes supported by the second wireless device.

Some examples of the method, apparatuses, and non-transitory computer-readable medium described herein may further include operations, features, means, or instructions for enabling clipping of a power amplifier at the first wireless device based on the set of ADC resolution sizes supported by the second wireless device.

Some examples of the method, apparatuses, and non-transitory computer-readable medium described herein may further include operations, features, means, or instructions for identifying one or more precoding parameters associated with the clipping of the power amplifier and transmitting, to the second wireless device, a message that includes an indication of one or more precoding parameters.

Some examples of the method, apparatuses, and non-transitory computer-readable medium described herein may further include operations, features, means, or instructions for identifying, within the capability message, an indication of a table that indicates an SQNR per bit quantity supported by the second wireless device, where communicating with the second wireless device may be based on the table.

Some examples of the method, apparatuses, and non-transitory computer-readable medium described herein may further include operations, features, means, or instructions for receiving, from the second wireless device, an indication of a power consumption factor associated with each ADC resolution size of the set of ADC resolution sizes.

In some examples of the method, apparatuses, and non-transitory computer-readable medium described herein, each bit quantity of the two or more bit quantities includes an integer value. In some examples of the method, apparatuses, and non-transitory computer-readable medium described herein, each bit quantity of the two or more bit quantities includes a positive real number.

In some examples of the method, apparatuses, and non-transitory computer-readable medium described herein, each ADC resolution size of the set of ADC resolution sizes indicates an ENOB for an ADC resolution.

In some examples of the method, apparatuses, and non-transitory computer-readable medium described herein, the first wireless device includes a base station and the second wireless device includes a UE.

DETAILED DESCRIPTION

Figure 1:
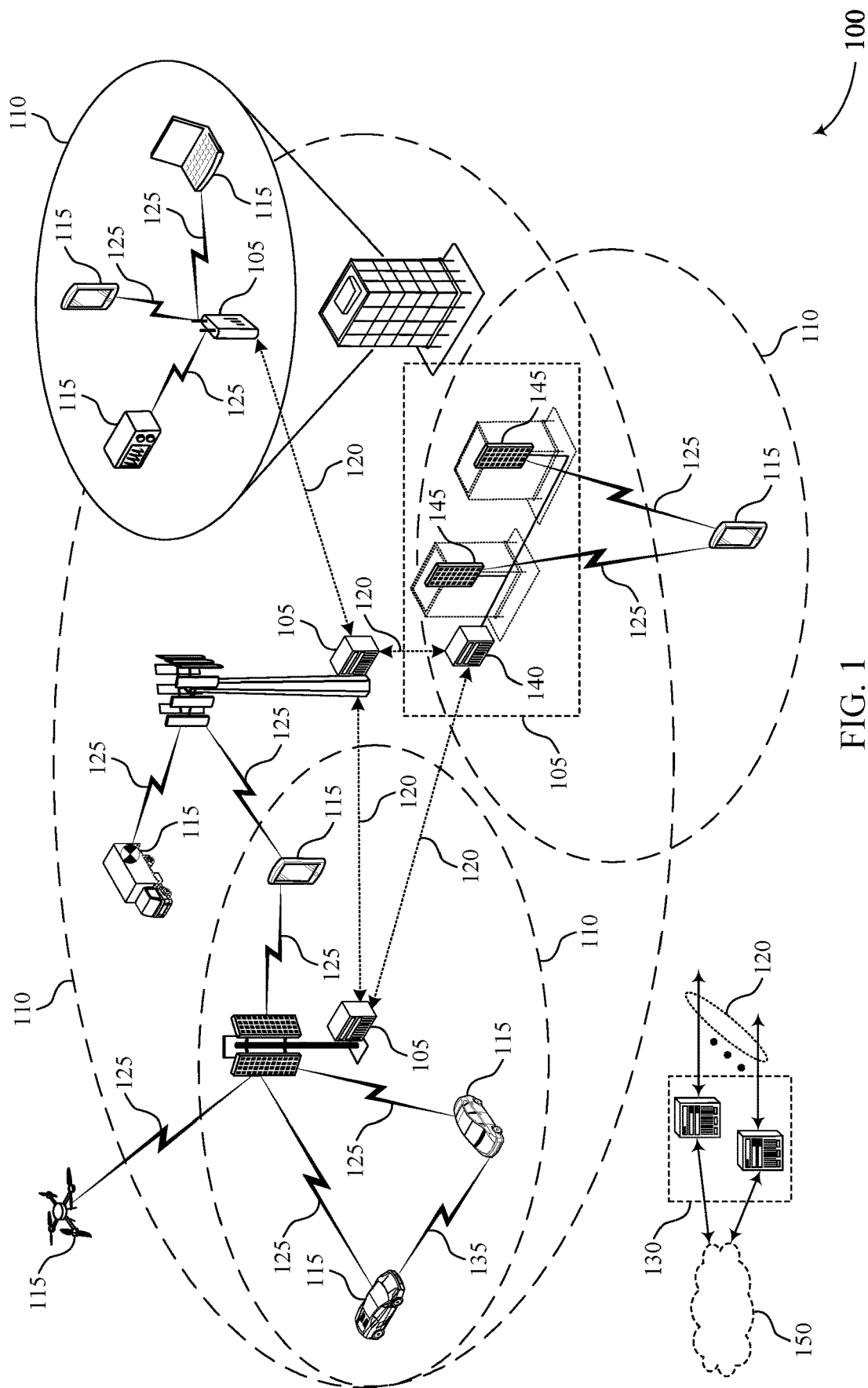
FIG. 1 illustrates an example of a wireless communications system that supports dynamic analog-to-digital converter (ADC) capabilities in accordance with aspects of the present disclosure.

In some wireless communications systems, a wireless device may process a signal received from another wireless device using an analog-to-digital converter (ADC). A sampling rate of an ADC may be based on the carrier frequency of the received signal. For example, in systems that support relatively higher carrier frequencies (e.g., such as frequency bands used in systems supporting frequency range 4 (FR4) (e.g., 52.6 GHz-114.25 GHz bands), FR5 (which may be referred to as "upper millimeter wave bands" or a "sub-THz regime"), FR6 (e.g., bands up to 3 THz), 5G communications, 6G communications, or the like), an ADC may likewise operate at higher sampling frequencies. In addition, the resolution of the processed signal (e.g., the digital output of the ADC) may be based on the number of bits the ADC is configured to support. For example, an ADC resolution may correspond to number of different values recognized by the ADC for an analog input, which may likewise corresponds to discrete levels for the digital output of the ADC. The ADC resolution may be referred to as a voltage or a number of bits. In some aspects, a relatively higher number of bits (e.g., a higher ADC resolution) may correspond to a greater resolution of a processed signal (e.g., a relatively higher bit value may correspond to a greater number of discrete digital levels for an output of the ADC).

However, power consumption of the ADC and, subsequently, other components of the UE (e.g., digital front end (DFE) components) may increase as the sampling frequency and resolution (e.g., number of bits) increase. For example, ADC power consumption may increase linearly with the sampling frequency and exponentially with the number of bits used. Consequentially, using relatively higher carrier frequencies may result in greater power consumption at a wireless device. Thus, as a wireless device supports communications over a wide bandwidth of carrier frequencies, optimal system function may be dependent on the ability to modulate or reduce a number of bits used by the ADC. For example, the use of low-resolution ADCs may reduce power consumption at a wireless device, thereby improving power consumption and battery life at a wireless device, particularly those wireless devices operating at relatively higher frequency ranges.

As described herein, a wireless device (e.g., a UE) may support an ADC with a dynamically configurable resolution size, enabling power saving techniques for signals processed by the wireless device (e.g., the dynamic ADC resolution may likewise reduce DFE power consumption by processing a lower-bit width baseband signal). Further, a dynamic ADC resolution may be configured for efficiently balancing the tradeoff between power consumption and performance (e.g., signal resolution) of the wireless device. In such cases, the wireless device may transmit a message (e.g., a capability message) to another wireless device (e.g., a base station, a gNB, or the like) that indicates the support of dynamic ADC capabilities. The message may include an indication of a set of ADC resolution sizes supported by the wireless device. In some examples, the wireless device may include the capability message as part of a control message (e.g., a radio resource control (RRC) message).

The UE may include, in the capability message, one or more of an indication of a capability to configure/reconfigure various ADC resolutions, a set of supported ADC resolution sizes (e.g., including two or more bit quantities), a table of signal-to-quantization noise ratio (SQNR) values per ADC resolution size, other information associated with the dynamic ADC, or any combination thereof. In some cases, the wireless device may report the ADC resolution sizes as integer values. In other aspects, the wireless device may report the list of ADC resolution sizes as positive real numbers. In either case, each ADC resolution size of the set of ADC resolution sizes may represent an effective number of bits (ENOB) of the ADC. Another wireless device (e.g., a base station) receiving such capability signaling may optimize communications with the wireless device based, in part, on the dynamic ADC resolution sizes that are indicated. For instance, a base station may optimize signaling and communications between the base station and UE in accordance with a relationship between ADC resolution size and signal throughput, power consumption factors, UE battery status, or any combination thereof, among other examples.

Aspects of the disclosure are initially described in the context of wireless communications systems. Aspects of the disclosure are further described in the context of a process flow. Aspects of the disclosure are further illustrated by and described with reference to apparatus diagrams, system diagrams, and flowcharts that relate to dynamic ADC capabilities.

FIG. 1 illustrates an example of a wireless communications system 100 that supports dynamic ADC capabilities in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some examples (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different radio access technology).

The communication links 125 shown in the wireless communications system 100 may include uplink transmissions from a UE 115 to a base station 105, or downlink transmissions from a base station 105 to a UE 115. Carriers may carry downlink or uplink communications (e.g., in an FDD mode) or may be configured to carry downlink and uplink communications (e.g., in a TDD mode).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of determined bandwidths for carriers of a particular radio access technology (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may include one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

One or more numerologies for a carrier may be supported, where a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the base stations 105 or the UEs 115 may be expressed in multiples of a basic time unit which may, for example, refer to a sampling period of $T_s = 1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot, or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

In some systems, the D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., base stations 105) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, for example, in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the base stations 105, and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A base station 105 or a UE 115 may use beam sweeping techniques as part of beam forming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some examples, transmissions by a device (e.g., by a base station 105 or a UE 115) may be performed using multiple beam directions, and the device may use a combination of digital precoding or radio frequency beamforming to generate a combined beam for transmission (e.g., from a base station 105 to a UE 115). The UE 115 may report feedback that indicates precoding weights for one or more beam directions, and the feedback may correspond to a configured number of beams across a system bandwidth or one or more sub-bands. The base station 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or for transmitting a signal in a single direction (e.g., for transmitting data to a receiving device).

A receiving device (e.g., a UE 115) may try multiple receive configurations (e.g., directional listening) when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned in a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use error detection techniques, error correction techniques, or both to support retransmissions at the MAC layer to improve link efficiency. In the control plane, the RRC protocol layer may provide establishment, configuration, and maintenance of an RRC connection between a UE 115 and a base station 105 or a core network 130 supporting radio bearers for user plane data. At the physical layer, transport channels may be mapped to physical channels.

The UEs 115 and the base stations 105 may support retransmissions of data to increase the likelihood that data is received successfully. Hybrid automatic repeat request (HARQ) feedback is one technique for increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In other cases, the device may provide HARQ feedback in a subsequent slot, or according to some other time interval.

A UE 115 attempting to access a wireless network may perform an initial cell search by detecting a primary synchronization signal (PSS) from a base station 105. The PSS may enable synchronization of slot timing and may indicate a physical layer identity value. The UE 115 may then receive a secondary synchronization signal (SSS). The SSS may enable radio frame synchronization, and may provide a cell identity value, which may be combined with the physical layer identity value to identify the cell. The SSS may also enable detection of a duplexing mode and a cyclic prefix length. Some systems, such as TDD systems, may transmit an SSS but not a PSS. Both the PSS and the SSS may be located in the central 62 and 72 subcarriers of a carrier, respectively. In some cases, a base station 105 may transmit synchronization signals (e.g., PSS SSS, and the like) using multiple beams in a beam-sweeping manner through a cell coverage area. In some cases, PSS, SSS, and/or broadcast information (e.g., a physical broadcast channel (PBCH)) may be transmitted within different synchronization signal (SS) blocks on respective directional beams, where one or more SS blocks may be included within an SS burst (or SS burst set).

After completing initial cell synchronization, a UE 115 may decode a master information block (MIB), and one or more system information blocks (SIBs) (e.g., SIB1 and SIB2) prior to accessing the network. The MIB may be transmitted on a physical broadcast channel (PBCH) and may utilize, for example, the first 4 OFDMA symbols of the second slot of the first subframe of each radio frame. It may use the middle 6 RBs (72 subcarriers) in the frequency domain. The MIB carries some information for UE initial access, including: downlink channel bandwidth in term of RBs, a physical HARQ indicator channel (PHICH) configuration (duration and resource assignment), and SFN. A new MIB may be broadcast every fourth radio frame (SFN mod 4=0) at and rebroadcast every frame (10 ms). Each repetition is scrambled with a different scrambling code. After reading a MIB (either a new version or a copy), the UE 115 may try different phases of a scrambling code until it gets a successful CRC check. The phase of the scrambling code (0, 1, 2 or 3) may enable the UE 115 to identify which of the four repetitions has been received. Thus, the UE 115 may determine the current SFN by reading the SFN in the decoded transmission and adding the scrambling code phase. After receiving the MIB, a UE 115 may receive one or more SIBs. Different SIBs may be defined according to the type of system information conveyed. A new SIB1 may be transmitted in the fifth subframe of every eighth frame (SFN mod 8=0) and rebroadcast every other frame (20 ms). SIB1 includes access information, including cell identity information, and it may indicate whether a UE 115 is allowed to camp on a cell. SIB1 also includes cell selection information (or cell selection parameters). Additionally, SIB1 includes scheduling information for other SIBs. SIB2 may be scheduled dynamically according to information in SIB1, and includes access information and parameters related to common and shared channels. The periodicity of SIB2 may be set to 8, 16, 32, 64, 128, 256 or 512 radio frames.

After the UE 115 decodes SIB2, it may transmit a random access channel (RACH) preamble to a base station 105. For example, the RACH preamble may be randomly selected from a set of 64 predetermined sequences. This may enable the base station 105 to distinguish between multiple UEs 115 trying to access the system simultaneously. The base station 105 may respond with a random access response that provides an uplink resource grant, a timing advance, and a temporary cell-radio network temporary identifier (C-RNTI). The UE 115 may then transmit an RRC connection request along with a temporary mobile subscriber identity (TMSI) (if the UE 115 has previously been connected to the same wireless network) or a random identifier. The RRC connection request may also indicate the reason the UE 115 is connecting to the network (e.g., emergency, signaling, data exchange, etc.). The base station 105 may respond to the connection request with a contention resolution message addressed to the UE 115, which may provide a new C-RNTI. If the UE 115 receives a contention resolution message with the correct identification, it may proceed with RRC setup. If the UE 115 does not receive a contention resolution message (e.g., if there is a conflict with another UE 115) it may repeat the RACH process by transmitting a new RACH preamble.

After receiving the PSS and SSS, the UE 115 may receive a MIB, which may be transmitted in the PBCH. The MIB may contain system bandwidth information, an SFN, and a PHICH configuration. After decoding the MIB, the UE 115 may receive one or more SIBs. For example, SIB1 may contain cell access parameters and scheduling information for other SIBs. Decoding SIB1 may enable the UE 115 to receive SIB2. SIB2 may contain RRC configuration information related to RACH procedures, paging, PUCCH, PUSCH, power control, SRS, and cell barring.

In some examples, a UE 115 may transmit a capability message, including an indication of a set of ADC resolutions supported by the UE 115, to another wireless device (e.g., a base station 105, a gNB, or the like) using a communication link 125. The capability message may be transmitted during connection establishment procedures with a network, and the UE 115 may indicate a capability to reconfigure its ADC resolution, a set of supported ADC resolution sizes including two or more bit quantities, a table of SQNR values per ADC resolution in the capability message, or any combination thereof. A receiving base station 105 may use this capability message to optimize the UE 115 ADC resolution. The base station 105 may optimize communications with the UE 115 based on the dynamic ADC resolution capability of the UE 115. For example, the base station 105 may configure communications according to a relationship between the ADC resolution size and one or more of signal throughput, power consumption factor, or UE battery status. Additionally or alternatively, the base station 105 may use the indicated ADC capability to allow clipping of a power amplifier for a transmitted signal, where the signal may be efficiently reconstructed by the UE 115 based on the supported ADC resolution sizes.

Figure 2:
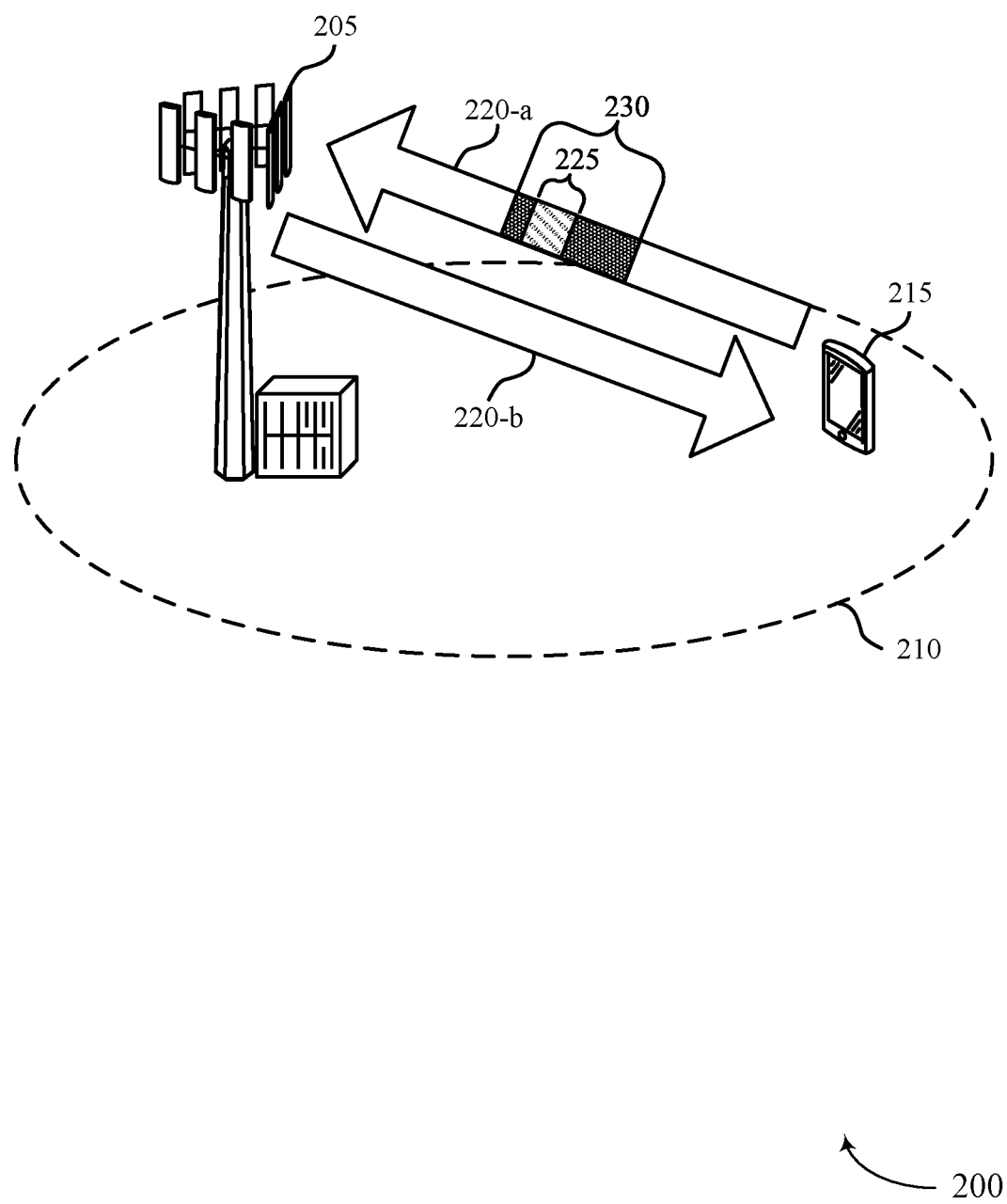
FIG. 2 illustrates an example of a wireless communications system that supports dynamic ADC capabilities in accordance with aspects of the present disclosure.

FIG. 2 illustrates an example of a wireless communications system 200 that supports dynamic ADC converter capability in accordance with aspects of the present disclosure. In some examples, wireless communications system 200 may implement aspects of wireless communications system 100. The wireless communications system 200 includes a UE 215 and a base station 205, which may be examples of a UE 115 and base station 105, respectively, as described with reference to FIG. 1. It is to be understood that references to specific wireless devices (e.g., UEs or base stations) in the below figures are provided for illustrative purposes, and different wireless devices not specifically referred to herein may be used interchangeably with those described herein. Likewise, the described operations performed by a UE 215 may, in some cases, be performed by a base station 205, and vice versa. Additionally, or alternatively, the base station 205 may be an example of an IAB node, a repeater node (e.g., configured with some retransmission capability), or the like.

The base station 205 and the UE 215 may be located in coverage area 210. The base station 205 and UE 215 may perform a connection establishment procedure (such as a random access procedure or the like) and may communicate over one or more communication links 220 (e.g., uplink 220-a and downlink 220-b) upon establishing a connection. In some examples, the base station 205 and UE 215 may communicate using a relatively higher frequency bands, which may have a relatively large bandwidth or larger portions of a bandwidth allocated for communications. As an example, wireless communications system 200 may support communications using 5G or NR technologies, communications using 6G technologies or other standardized wireless technologies, communications in FR4 (e.g., 52.6 GHz-114.25 GHz bands), FR5 (which may be referred to as "upper millimeter wave bands" or a "sub-THz regime), and beyond (e.g., bands up to 3 THz).

The communication links 220 may include an uplink 220-a and downlink 220-b. If the base station 205 transmits a signal to the UE 215, the UE 215 may process the received signal using various components of a receiver chain, which may include an analog front end (AFE), an ADC, a DFE (e.g., comprising one or more filters, one or more local oscillators, one or more sampling-rate converters, or the like), and other components. The ADC may convert the signal from an analog signal to a digital signal by quantizing a voltage range and sampling the signal with the quantized voltages at a particular sampling frequency. In some examples, quantization of the ADC may be non-uniform (e.g., a digital output of the ADC may be non-linear). For instance, the ADC may quantize the incoming analog signal with non-uniform voltage steps. In such examples, a first voltage step may correspond to 2 volts where a second voltage step may correspond to 3 volts. The resolution of the processed signal may be based on a number of bits corresponding to the ADC resolution. For example, a larger number of bits may allow for greater signal resolution (e.g., a greater number of discrete digital "steps" or values that represent the analog signal), which may result in reliable communications. However, as the number of bits supported by an ADC increases, ADC power consumption and, consequentially, power consumption by other components of the UE 215 (e.g., DFE components) may also increase. Particularly, ADC power consumption may increase exponentially with the number of bits used for the ADC resolution (e.g., 2N, where N is the ADC number of bits). As a wireless device may be able to support communications over a wide range of carrier frequencies, optimal system function and power management may be improved with an ability to modulate or dynamically reduce the ADC number of bits when processing a signal.

In some examples, the UE 215 may be configured with or include a dynamic ADC such that the UE 215 may adjust or change a resolution size of the ADC (e.g., change a number of bits used by the ADC) for processing a received signal. For instance, the UE 215 may adjust the number of bits used in the ADC based on a configuration of communications with the base station 205. In some other examples, the UE 215 may modify its ADC resolution based on an indication from the base station 205. Based on the support of a dynamic ADC, the UE 215 may determine a set of ADC resolution sizes (e.g., two or more bit quantities, where each bit quantity may correspond to an ADC resolution size) that the UE 215 supports, and the UE 215 may dynamically configure the two or more bit quantities. The UE 215 may transmit, over uplink 220-a, a capability message 225 to the base station 205 indicating the set of ADC resolution sizes supported by the UE 215. Based on the capabilities indicated by the UE 215, the base station 205 may optimize communications using the information about the supported ADC resolution sizes. In some examples, the capability message 225 may be included in a control message 230 (e.g., an RRC message). In some examples, the capability message 225 may indicate that the UE 215 is capable of reconfiguring the ADC resolution.

The capability message 225 may indicate a set of ADC resolution sizes supported by the dynamic ADC. For example, the capability message may include a list of two or more bit quantities that are configurable by the UE 215. The list of two or more bit quantities may represent the ADC resolution size. The list of two or more bit quantities may be reported as integer numbers or positive real numbers. For instance, the UE 215 may identify an integer value corresponding to each bit quantity or a positive real number corresponding to each bit quantity. In any case, each ADC resolution may indicate an ENOB of the ADC, where the ENOB of the ADC may represent a number of bits an ADC may use after noise errors and rounding errors related to analog-to-digital conversion. For example, an ADC may configure itself to convert signals using a resolution corresponding to 10 bits, but due to various factors such as quantization noise, signal clipping, sampling error, or the like, the ENOB of the ADC may be 8.2 bits. The ADC resolutions supported by the UE 215 may be indicated using other techniques, schemes, or formats, and the examples described herein should not be considered limiting.

In some examples, the UE 215 may generate a table of SQNR per number of bits supported, which may be signaled to the base station 205 (e.g., included in the capability message 225 or via other signaling). The SQNR table may be a representation of the relationship between a ratio of the signal strength to the quantization noise per bit quantity (i.e., per ADC resolution size). Here, the quantization noise may refer to a representation of inherent rounding errors in ADC conversion and may be based on the ADC resolution, as illustrated in the examples of Table 1.

TABLE 1

SQNR per ADC number of bits

| | Number of bits | | | | | |
|---|---|---|---|---|---|---|
| | 1 | 2 | 3 | 4 | 5 | 6 |
| SQNR [dB] | 5 | 10 | 15 | 20 | 25 | 30 |

Including the SQNR table in the capability message 225 may enable the base station 205 to optimize communications based on the relationship between the ADC resolution size and SQNR. For instance, the base station 205 may configure or modify communications with the UE 215 based on the values reported in the SQNR table. In other examples, the base station 205 may allow clipping of a power amplifier for a transmitted signal, where the signal may be efficiently reconstructed by the UE 215 based on the UE's dynamic ADC resolution size. Additionally, the base station 205 may adjust one or more communication parameters based on the SQNR table reported by the UE 215. In some examples, the base station 205 may determine communication parameters based on a performance tradeoff, such as between the increased resolution of a higher number of bits and the noise introduced by that number of bits. The base station 205 may also take into account power consumption at the UE 215 based on the ADC resolution (where a relatively lower ADC resolution may result in increased power savings).

In some examples, the UE 215 may indicate, to the base station 205, information about a factor of power consumption corresponding to each ADC resolution size. Reporting power consumption information and the relation of each ADC resolution size may help the base station 205 configure communications for power efficiency at the UE 215. For example, using 6 bits in the ADC may cause the UE 215 to consume relatively more (e.g., 4 times as much) power as using 4 bits in the ADC. In such cases, the base station 205 may analyze the power and resolution tradeoffs and may optimize the ADC resolution size of the UE 215 accordingly. For example, the base station 205 may determine that the UE 215 should be configured with 4 bits at the ADC to reduce power consumption at the UE 215. This may be especially useful in a situation where the UE 215 is in a particular mode, such as a power saving mode, at a cell edge, or the like. Alternatively, the base station 205 may determine that power consumption is less important than achieving a high resolution and reliability in communications, and the base station 205 may determine that the UE 215 may utilize a different resolution (e.g., 6 bits) at the ADC.

In some other examples, a UE 215 may not have a dynamic ADC. Rather, the UE 215 may have a static ADC resolution size. The UE 215 may thus send a capability message 225 indicating that the UE 215 is unable to reconfigure an ADC resolution size. For example, a UE 215 with a 5 bit ADC may send, to a base station 205, an indication that the UE 215 cannot reconfigure its ADC resolution and that it has a some ADC resolution size. The base station 205 may therefore identify various devices (e.g., UEs) that are communicating with the base station 205, and their ADC capabilities, and may configure communications with the devices accordingly.

In some examples, the base station 205 may receive and process the capability message 225, where the base station 205 may use the capability message 225 to optimize communications with the UE 215 based on the ADC resolution of the UE 215. For example, the base station 205 may adjust an operating frequency range. In some examples, the base station 205 may process the capability message 225 based on signal statistics and may be able to adjust for non-linear quantization of the UE 215 ADC. The optimization may be based on the capability message 225, a power consumption factor of each ADC resolution, a signal throughput, a UE battery status, or any combination thereof, among other examples.

The base station 205 may report, to the UE 215, optimized communications parameters, the optimal resolution for the ADC of the UE 215, or the like, e.g., over downlink 220-*b*. In some cases, the base station 205 may use the capability information associated with the capabilities of the UE 215 (e.g., including the ADC capabilities of the UE 215) and may allow clipping of a power amplifier (PA). In such cases, a clipped signal may be reconstructed by a receiver of the UE 215, where the reconstruction may be based on the set of ADC resolution sizes indicated in the capability message 225 from the UE 215. Information about the relationship between the clipped signal and the original signal may be transmitted in the report to the UE 215. For example, the base station 205 may identify one or more precoders associated with the clipped signal, and the base station 205 may transmit a message to the UE 215 that indicates the one or more precoders (or precoding parameters). In some additional or alternative aspects, one or more predefined or preconfigured precoders may be used. In any case, the base station 205 may use the capability information of the UE to optimize the clipping of the PA. The UE 215 may use the precoding parameters to process subsequent received messages (e.g., from the base station 205).

The base station 205 and the UE 215 may thus communicate (e.g., over the communication links 220) based on the dynamic ADC resolution size(s). For instance, the UE 215 may select an ADC resolution size (e.g., from the set of ADC resolution sizes) to use for processing one or more received messages (e.g., messages received from the base station 205). In some examples, the UE 215 may use various noise suppression procedures, such as a non-uniform quantization procedure, a nonlinear distortion suppression procedure, a signal reconstruction procedure, or some combination thereof, to process the one or more messages. Additionally, or alternatively, the UE 215 may process the one or more messages using digital post distortion (DPOD) operations. Such procedures and operations may be based on the dynamic ADC resolution sizes supported by the UE 215 and used when a message is received and processed.

Figure 3:
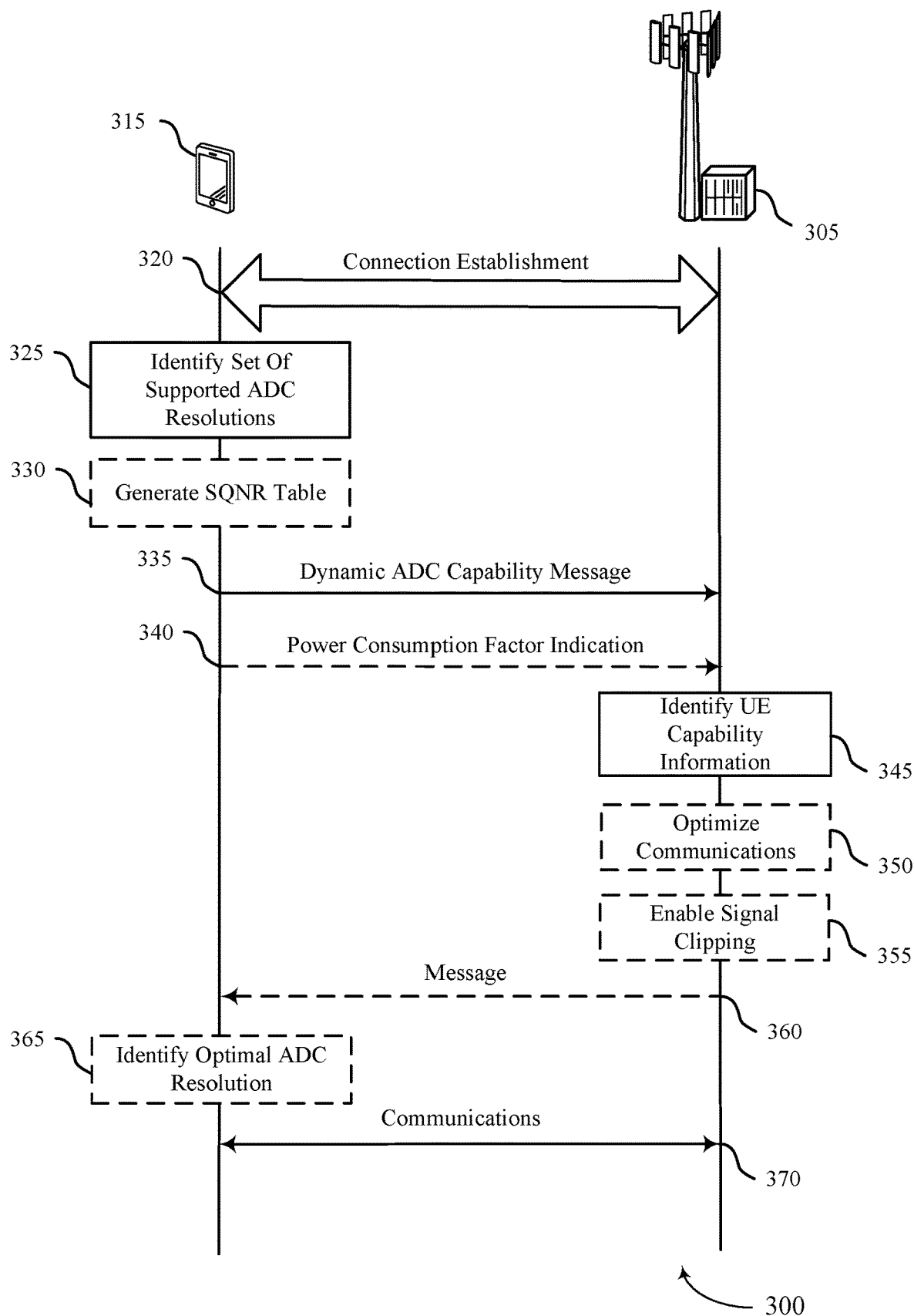
FIG. 3 illustrates an example of a process flow in a system that supports dynamic ADC capabilities in accordance with aspects of the present disclosure.

FIG. 3 illustrates an example of a process flow 300 in a system that supports dynamic ADC capabilities in accordance with aspects of the present disclosure. Process flow 300 may include a base station 305 and a UE 315, which may be examples of equivalent wireless devices as described herein. In the following description of the process flow 300, the operations between the UE 315 and the base station 305 may be transmitted in a different order than the exemplary order shown, or the operations performed by the UE 315 and the base station 305 may be performed in different orders or at different times. Certain operations may also be left out of the process flow 300, or other operations may be added to the process flow 300. It is to be understood that while the UE 315 and the base station 305 are shown performing a number of the operations of process flow 300, any wireless device may perform the operations shown.

In some examples, the UE 315 may communicate with base station 305 using a relatively high frequency band (e.g., as utilized in 5G, FR4, FR5, FR6, 6, or the like). The UE 315 may process transmissions received from the base station 305 using an ADC, which may be an example of a dynamic ADC (e.g., supporting two or more ADC resolutions sizes). The ADC may convert a received signal from analog to digital by quantizing a voltage range and sampling the signal with the quantized voltages at a particular sampling frequency. The resolution of the digital signal may be based on the number of ADC bits. A higher number of ADC bits may correspond to a greater resolution. In some examples, greater sampling frequencies, a greater number of ADC bits, or the like, may be associated with the use of higher frequency bands, as a higher sampling rate and higher resolution may result in more accurate signal processing for higher frequency bands. Consequentially, increasing the ADC bits, and thus the ADC resolution size, may give rise to increased power consumption. Thus, modulating ADC resolution sizes may result in greater power performance and flexibility, and ultimately, greater system efficiency.

At 320, base station 305 and UE 315 may perform a connection establishment procedure. The connection establishment procedure may be initiated as a result of the UE 315 entering a coverage region served by the base station, a handover indication, or the like. For instance, the UE 315 may move from a first coverage area corresponding to a first base station to a second coverage area corresponding to a second base station (e.g., base station 305). As such, the UE 315 may send a signal to the second base station 305 that may initiate a connection establishment procedure. Additionally, or alternatively, the first base station may signal (e.g., through a backhaul link) to the second base station 305 that the second base station 305 should undergo a connection establishment procedure with the UE 315. The connection establishment may include the exchange of two or more RRC messages. Based on (or as part of) the connection establishment procedure at 320, the UE 315 may provide an indication of one or more capabilities of the UE 315. For example, the UE 315 may transmit a message (e.g., a capability message) that includes an indication of the capabilities of the UE 315.

At 325, the UE 315 may identify a set of resolution sizes supported by its ADC. For instance, the UE 315 may be capable of configuring or reconfiguring its ADC for various resolution sizes, and the UE 315 may identify a set of ADC resolution sizes the UE 315 supports. The set of ADC resolution sizes may be represented by two or more bit quantities. For instance, the UE 315 may identify a list of bit quantities that are dynamically configurable by the UE 315. In some cases, the list of bit quantities may be identified as (e.g., correspond to) integer numbers. The integer numbers may represent the ADC resolutions. For instance, a UE 315 with a 5 bit ADC, after all noise errors and rounding errors, may have an effective resolution of 4.2 bits. In such a case, the UE 315 may identify an ADC resolution of 5 bits. In some cases, the list of bit quantities may be indicated as positive real numbers. The positive real numbers may represent the ADC resolutions. In such a case, the UE 315 may identify an ADC resolution of 4.2. In some cases, each ADC resolution size (e.g., of the set of ADC resolution sizes) may represent an ENOB of the ADC. An ADC resolution size associated with an ENOB may represent the number of bits an ADC may use after all noise errors and rounding errors corresponding to analog-to-digital conversion. Such errors may be introduced by the quantization of the signal (e.g., truncating the real signal voltage to a quantized voltage), channel quality, sampling error, or the like. As per the last example, a UE 315 with a 5 bit ADC may have an effective resolution of 4.2 bits after noise errors and rounding errors are accounted for. In such a case, the UE 315 may identify a resolution of 4.2 bits.

At 330, optionally, the UE 315 may generate a table that indicates an SQNR per ADC resolution size (e.g., per bit quantity). An SQNR represents the relationship between signal strength and quantization noise during ADC conversion. The quantization noise may be inherent to ADC conversion, and such noise may be indicated to the base station 305. The UE 315 may determine an SQNR ratio for each ADC resolution size (e.g., each bit quantity), and each SQNR ratio may be mapped to each ADC resolution size. As such, the SQNR table may include a mapping of each SQNR ratio to each ADC resolution size of the set of ADC resolution sizes.

At 335, the UE 315 may prepare and transmit a capability message to the base station 305. The UE 315 may include, in the capability message, an indication of whether the UE 315 is capable of reconfiguring its ADC along with the set of supported ADC resolution sizes (e.g., as two or more bit quantities). In some cases, the bit quantities may be represented by positive real numbers. In some cases, the bit quantities may be represented by integer values. In any case, each ADC resolution indicated in the capability message may indicate an ENOB. Additionally or alternatively, the UE 315 may indicate the SQNR table in the capability message (or via another message). The base station 305 may receive the capability message for the subsequent ADC resolution optimization.

At 340, the UE 315 may optionally transmit, and the base station 305 may receive, an indication of a power consumption factor. The power consumption factor may represent the power consumption related to each ADC resolution. The UE 315 may include an indication of this information to the base station 305 within the message indicating the power consumption factor, or within the capability message at 335. The base station 305 may receive the power consumption factor and may use the power consumption factor in an ADC resolution optimization. This information may enable the base station 305 to determine a tradeoff between power consumption and resolution (e.g., performance).

At 345, the base station 305 may identify the set of ADC resolution sizes supported by the UE 315 based on receiving the capability message at 335 and, in some cases, on receiving the power consumption factor at 340. The capability message from UE 315 may include one or more of a set of ADC resolutions, a corresponding SQNR table, a power consumption factor, or other information.

At 350, the base station 305 may optimize communications based on the identified capability information. In some cases, the base station 305 may perform optimization based on a received power consumption factor indication, e.g., received at 340. The base station 305 may adjust one or more communication parameters, enable clipping of a PA, or the like, such that the UE 315 may use an ADC resolution size that will save power, process signals with a greater resolution, or enable a balance of power consumption and communications reliability.

In some examples, at 355, the base station 305 may enable clipping of an outgoing signal based on the received set of ADC resolution sizes supported by the UE 315. For example, the base station 305 may enable clipping of the PA based on knowledge of the capabilities of UE 315. In such examples, the base station 305 may identify one or more precoding parameters associated with the clipping of the power amplifier.

At 360, the base station 305 may optionally transmit a message to the UE 315, which may include information relevant to subsequent communications. For example, the base station 305 may identify one or more precoding parameters (e.g., associated with the clipping of the PA at 355) and may transmit, to the UE 315, an indication of the one or more precoding parameters. In some cases, the message may indicate an optimized ADC resolution(s). In some examples, the precoding information may be predefined. Here, the UE may receive the precoding message and use the precoding information when processing a received signal.

At 365, the UE 315 may identify the optimal ADC resolution. In some examples, the UE 315 may select an ADC resolution size (e.g., from the set of ADC resolution sizes) based on receiving one or more messages from the base station 305. For example, the UE 315 may identify and select the ADC resolution size indicated by the base station 305 or based on communications configured by the base station 305.

At 370, the base station 305 and the UE 315 may communicate based on the set of ADC resolution sizes. The UE 315 may use the identified information as provided in the precoding message received at 360 to process and reconstruct signaling from the base station 305. In such cases, the UE 315 may process received messages (e.g., received from the base station 305), for example, based on the set of ADC resolution sizes. In some examples, based on receiving messages from the base station 305, the UE 315 may select an ADC resolution size from the set of ADC resolution sizes as indicated in the message at 360. Based on the selected ADC resolution size, the UE 315 may reconfigure the number of bits of the ADC. The UE 315 may use the selected ADC resolution size to process one or more subsequent messages. In some examples, the UE 315 may identify one or more predefined precoding parameters based on the set of supported ADC resolution sizes. In this example, the UE 315 may process received messages based on the predefined precoding parameters. In some examples, the UE 315 may process one or more messages using a noise suppression procedure based on the selected ADC resolution size. In such a case, the UE 315 may suppress signal noise by way of a non-uniform quantization procedure, a nonlinear distortion suppression procedure, DPOD, or any combination thereof.

Figure 4:
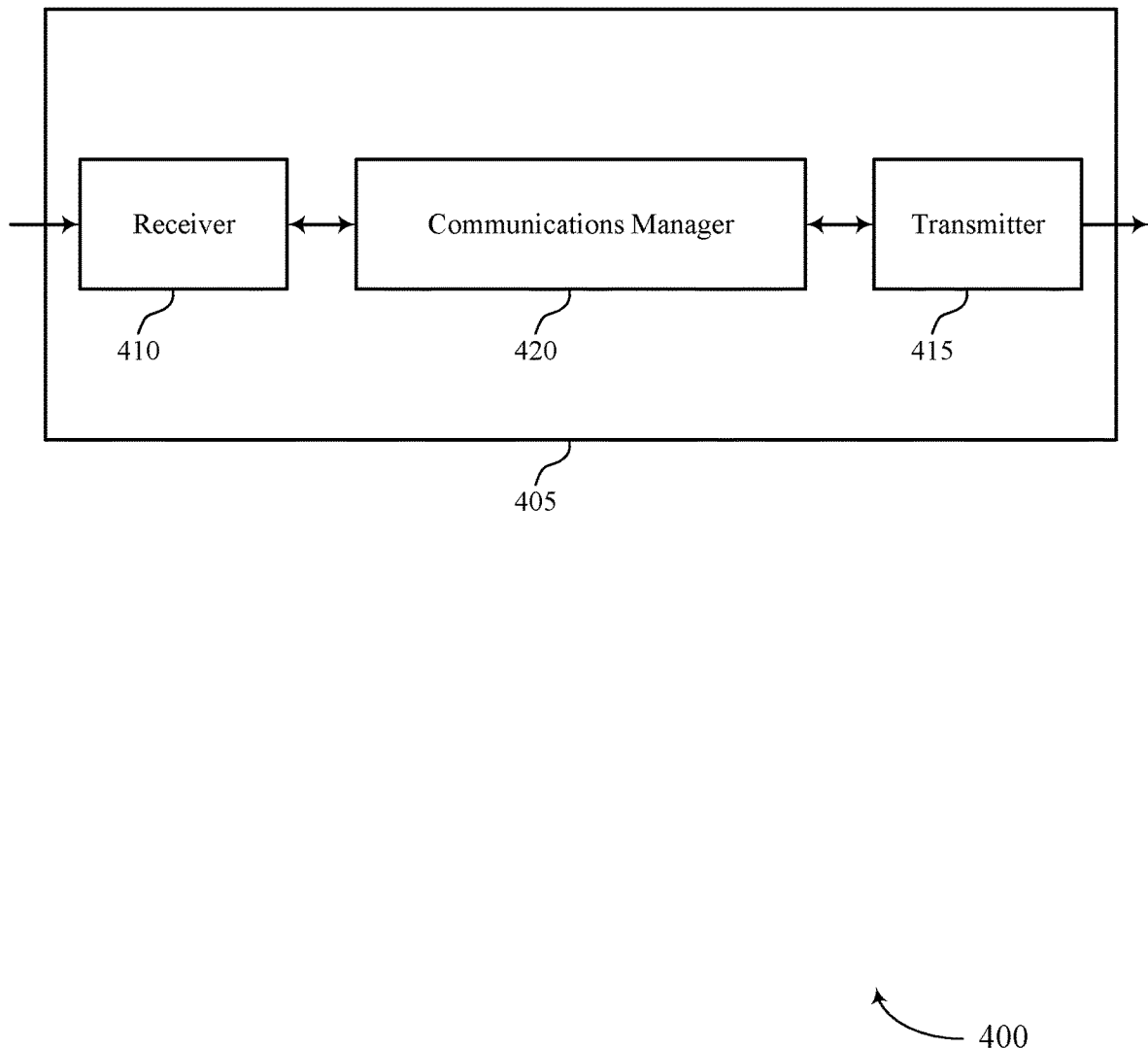
FIGS. 4 and 5 show block diagrams of devices that support dynamic ADC capabilities in accordance with aspects of the present disclosure.

FIG. 4 shows a block diagram 400 of a device 405 that supports dynamic ADC capabilities in accordance with aspects of the present disclosure. The device 405 may be an example of aspects of a UE 115 as described herein. The device 405 may include a receiver 410, a transmitter 415, and a communications manager 420. The device 405 may also include a processor. Each of these components may be in communication with one another (e.g., via one or more buses).

The receiver 410 may provide a means for receiving information such as packets, user data, control information, or any combination thereof associated with various information channels (e.g., control channels, data channels, information channels related to dynamic ADC capabilities). Information may be passed on to other components of the device 405. The receiver 410 may utilize a single antenna or a set of multiple antennas.

The transmitter 415 may provide a means for transmitting signals generated by other components of the device 405. For example, the transmitter 415 may transmit information such as packets, user data, control information, or any combination thereof associated with various information channels (e.g., control channels, data channels, information channels related to dynamic ADC capabilities). In some examples, the transmitter 415 may be co-located with a receiver 410 in a transceiver module. The transmitter 415 may utilize a single antenna or a set of multiple antennas.

The communications manager 420, the receiver 410, the transmitter 415, or various combinations thereof or various components thereof may be examples of means for performing various aspects of dynamic ADC capabilities as described herein. For example, the communications manager 420, the receiver 410, the transmitter 415, or various combinations or components thereof may support a method for performing one or more of the functions described herein.

In some examples, the communications manager 420, the receiver 410, the transmitter 415, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 420, the receiver 410, the transmitter 415, or various combinations or components thereof may be implemented in code (e.g., as communications management software or firmware) executed by a processor. If implemented in code executed by a processor, the functions of the communications manager 420, the receiver 410, the transmitter 415, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions described in the present disclosure).

In some examples, the communications manager 420 may be configured to perform various operations (e.g., receiving, monitoring, transmitting) using or otherwise in cooperation with the receiver 410, the transmitter 415, or both. For example, the communications manager 420 may receive information from the receiver 410, send information to the transmitter 415, or be integrated in combination with the receiver 410, the transmitter 415, or both to receive information, transmit information, or perform various other operations as described herein.

For example, the communications manager 420 may be configured as or otherwise support a means for performing a connection establishment procedure with a second wireless device. The communications manager 420 may be configured as or otherwise support a means for identifying, based on performing the connection establishment procedure, a set of ADC resolution sizes supported by the first wireless device, the set of ADC resolution sizes including two or more bit quantities that are dynamically configurable by the first wireless device. The communications manager 420 may be configured as or otherwise support a means for transmitting, to the second wireless device, a capability message that includes an indication of the set of ADC resolution sizes supported by the first wireless device.

By including or configuring the communications manager 420 in accordance with examples as described herein, the device 405 (e.g., a processor controlling or otherwise coupled to the receiver 410, the transmitter 415, the communications manager 420, or a combination thereof) may support techniques for identifying one or more of a UE ADC capability, a set of supported ADC resolution sizes, a SQNR per ADC resolution size, or a power consumption factor. The device 405 may thus reconfigure itself with an optimized ADC resolution accordingly, which may result in more efficient system performance and communications. Additionally, using a lower ADC resolution may provide reduced power consumption at the device 405, while using a higher ADC resolution may provide increased performance.

Figure 5:
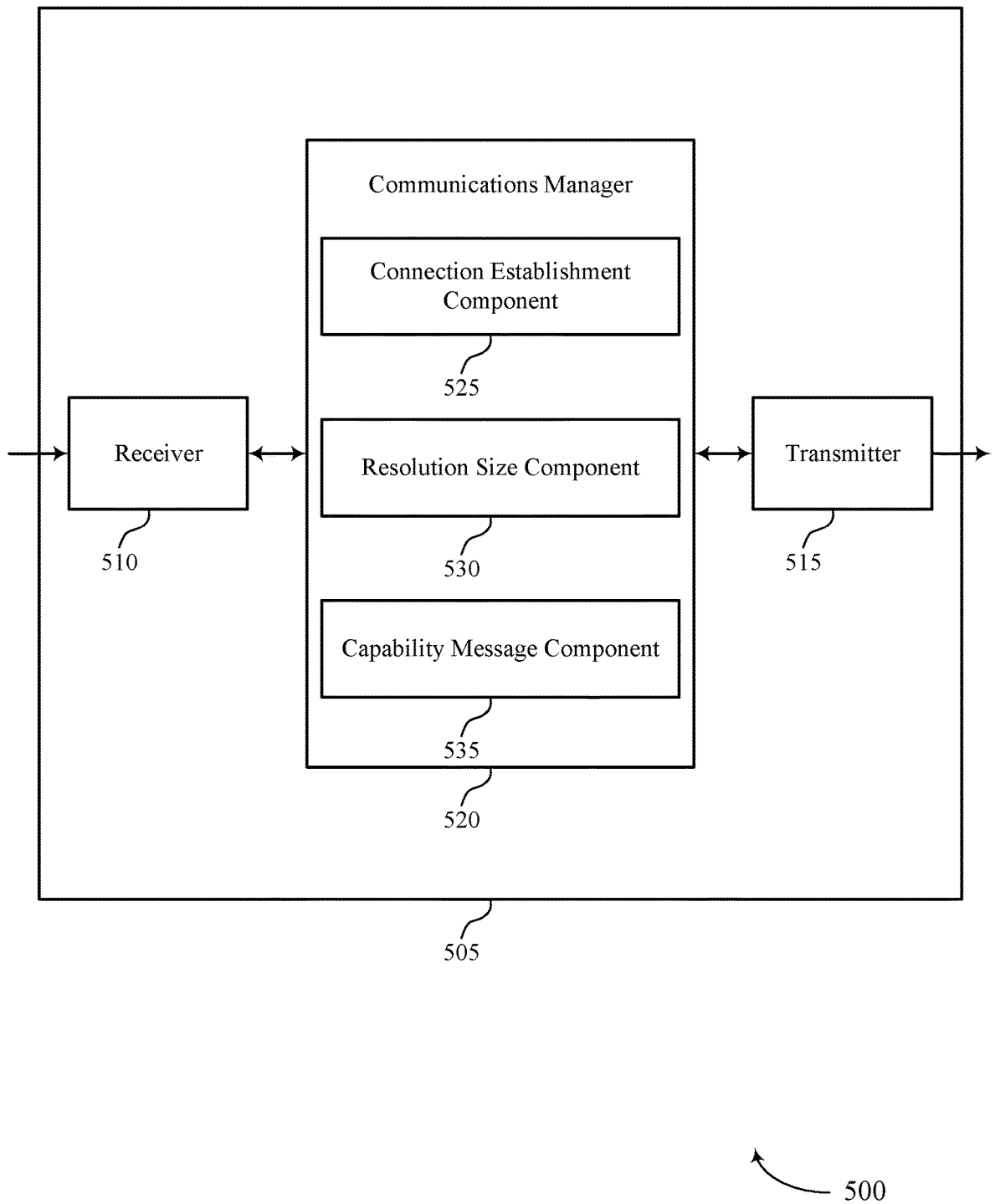

FIG. 5 shows a block diagram 500 of a device 505 that supports dynamic ADC capabilities in accordance with aspects of the present disclosure. The device 505 may be an example of aspects of a device 405 or a UE 115 as described herein. The device 505 may include a receiver 510, a transmitter 515, and a communications manager 520. The device 505 may also include a processor. Each of these components may be in communication with one another (e.g., via one or more buses).

The receiver 510 may provide a means for receiving information such as packets, user data, control information, or any combination thereof associated with various information channels (e.g., control channels, data channels, information channels related to dynamic ADC capabilities). Information may be passed on to other components of the device 505. The receiver 510 may utilize a single antenna or a set of multiple antennas.

The transmitter 515 may provide a means for transmitting signals generated by other components of the device 505. For example, the transmitter 515 may transmit information such as packets, user data, control information, or any combination thereof associated with various information channels (e.g., control channels, data channels, information channels related to dynamic ADC capabilities). In some examples, the transmitter 515 may be co-located with a receiver 510 in a transceiver module. The transmitter 515 may utilize a single antenna or a set of multiple antennas.

The device 505, or various components thereof, may be an example of means for performing various aspects of dynamic ADC capabilities as described herein. For example, the communications manager 520 may include a connection establishment component 525, a resolution size component 530, a capability message component 535, or any combination thereof. The communications manager 520 may be an example of aspects of a communications manager 420 as described herein. In some examples, the communications manager 520, or various components thereof, may be configured to perform various operations (e.g., receiving, monitoring, transmitting) using or otherwise in cooperation with the receiver 510, the transmitter 515, or both. For example, the communications manager 520 may receive information from the receiver 510, send information to the transmitter 515, or be integrated in combination with the receiver 510, the transmitter 515, or both to receive information, transmit information, or perform various other operations as described herein.

The connection establishment component 525 may be configured as or otherwise support a means for performing a connection establishment procedure with a second wireless device. The resolution size component 530 may be configured as or otherwise support a means for identifying, based on performing the connection establishment procedure, a set of ADC resolution sizes supported by the first wireless device, the set of ADC resolution sizes including two or more bit quantities that are dynamically configurable by the first wireless device. The capability message component 535 may be configured as or otherwise support a means for transmitting, to the second wireless device, a capability message that includes an indication of the set of ADC resolution sizes supported by the first wireless device.

Figure 6:
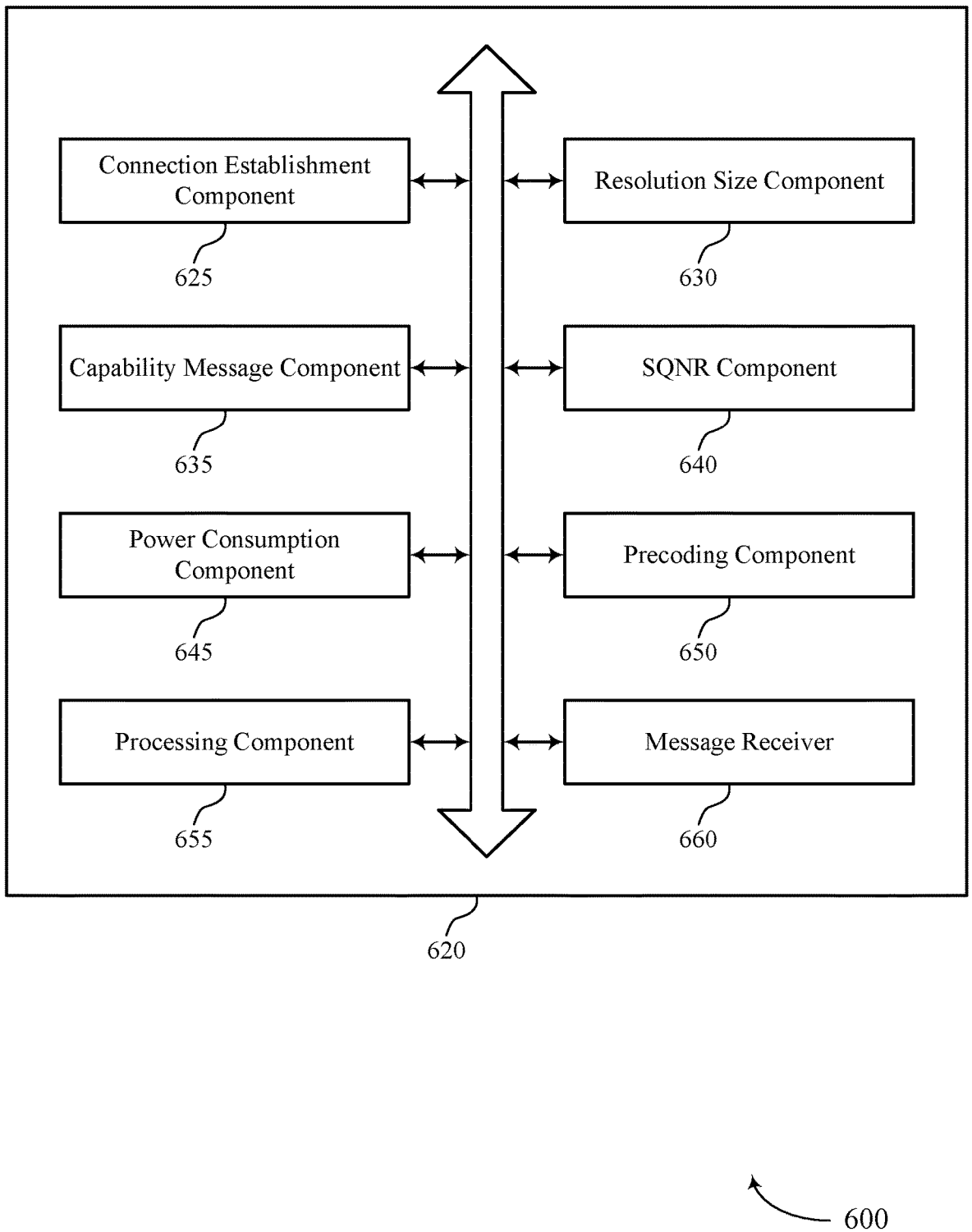
FIG. 6 shows a block diagram of a communications manager that supports dynamic ADC capabilities in accordance with aspects of the present disclosure.

FIG. 6 shows a block diagram 600 of a communications manager 620 that supports dynamic ADC capabilities in accordance with aspects of the present disclosure. The communications manager 620 may be an example of aspects of a communications manager 420, a communications manager 520, or both, as described herein. The communications manager 620, or various components thereof, may be an example of means for performing various aspects of dynamic ADC capabilities as described herein. For example, the communications manager 620 may include a connection establishment component 625, a resolution size component 630, a capability message component 635, an SQNR component 640, a power consumption component 645, a precoding component 650, a processing component 655, a message receiver 660, or any combination thereof. Each of these components may communicate, directly or indirectly, with one another (e.g., via one or more buses).

The connection establishment component 625 may be configured as or otherwise support a means for performing a connection establishment procedure with a second wireless device. The resolution size component 630 may be configured as or otherwise support a means for identifying, based on performing the connection establishment procedure, a set of ADC resolution sizes supported by the first wireless device, the set of ADC resolution sizes including two or more bit quantities that are dynamically configurable by the first wireless device. The capability message component 635 may be configured as or otherwise support a means for transmitting, to the second wireless device, a capability message that includes an indication of the set of ADC resolution sizes supported by the first wireless device.

In some examples, the SQNR component 640 may be configured as or otherwise support a means for generating a table indicating a signal-to-quantization noise ratio per bit quantity supported by the first wireless device based on the set of ADC resolution sizes. In some examples, the capability message component 635 may be configured as or otherwise support a means for transmitting an indication of the table as part of the capability message.

In some examples, the power consumption component 645 may be configured as or otherwise support a means for transmitting, to the second wireless device, an indication of a power consumption factor associated with each ADC resolution size of the set of ADC resolution sizes.

In some examples, to support identifying the set of ADC resolution sizes, the capability message component 635 may be configured as or otherwise support a means for identifying an integer value corresponding to each bit quantity of the two or more bit quantities, where the capability message includes an indication of the integer values.

In some examples, to support identifying the set of ADC resolution sizes, the capability message component 635 may be configured as or otherwise support a means for identifying a positive real number corresponding to each bit quantity of the two or more bit quantities, where the capability message includes an indication of the positive real numbers.

In some examples, each ADC resolution size of the set of ADC resolution sizes indicates an ENOB for an ADC resolution.

In some examples, the precoding component 650 may be configured as or otherwise support a means for receiving, from the second wireless device, a message indicating one or more precoding parameters that are based on the set of ADC resolution sizes supported by the first wireless device. In some examples, the processing component 655 may be configured as or otherwise support a means for processing a received message based on the one or more precoding parameters.

In some examples, the message receiver 660 may be configured as or otherwise support a means for receiving one or more messages from the second wireless device. In some examples, the resolution size component 630 may be configured as or otherwise support a means for selecting an ADC resolution size from the set of ADC resolution sizes for processing the one or more messages.

In some examples, the processing component 655 may be configured as or otherwise support a means for processing the one or more messages using a noise suppression procedure based on the selected ADC resolution.

In some examples, the noise suppression procedure includes a non-uniform quantization procedure, a nonlinear distortion suppression procedure, a signal reconstruction procedure, or any combination thereof.

In some examples, the first wireless device includes a UE and the second wireless device includes a base station.

Figure 7:
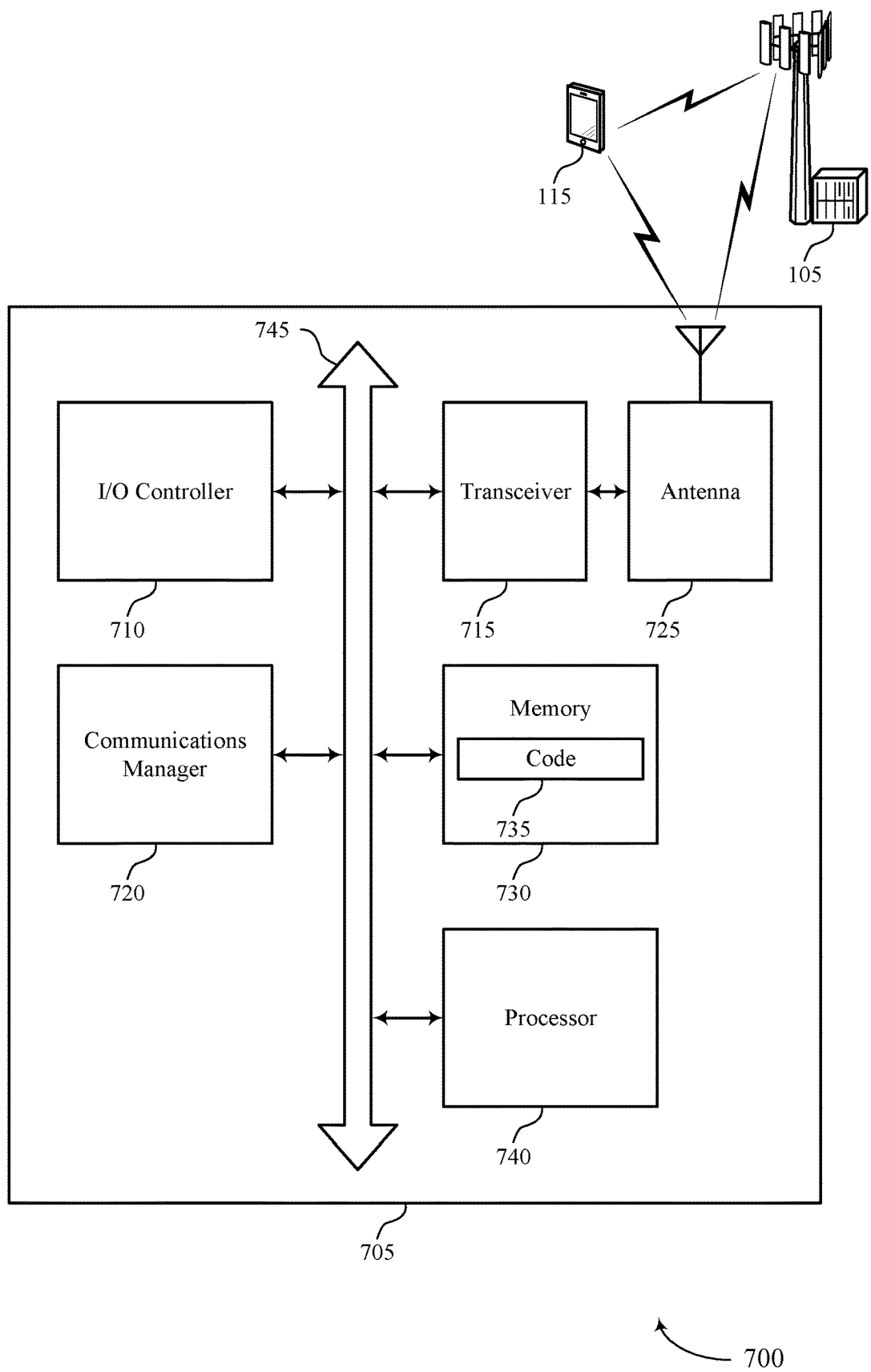
FIG. 7 shows a diagram of a system including a device that supports dynamic ADC capabilities in accordance with aspects of the present disclosure.

FIG. 7 shows a diagram of a system 700 including a device 705 that supports dynamic ADC capabilities in accordance with aspects of the present disclosure. The device 705 may be an example of or include the components of a device 405, a device 505, or a UE 115 as described herein. The device 705 may communicate wirelessly with one or more base stations 105, UEs 115, or any combination thereof. The device 705 may include components for bi-directional voice and data communications including components for transmitting and receiving communications, such as a communications manager 720, an input/output (I/O) controller 710, a transceiver 715, an antenna 725, a memory 730, code 735, and a processor 740. These components may be in electronic communication or otherwise coupled (e.g., operatively, communicatively, functionally, electronically, electrically) via one or more buses (e.g., a bus 745).

The I/O controller 710 may manage input and output signals for the device 705. The I/O controller 710 may also manage peripherals not integrated into the device 705. In some cases, the I/O controller 710 may represent a physical connection or port to an external peripheral. In some cases, the I/O controller 710 may utilize an operating system such as iOS®, ANDROID®, MS-DOS®, MS-WINDOWS®, OS/2®, UNIX®, LINUX®, or another known operating system. Additionally or alternatively, the I/O controller 710 may represent or interact with a modem, a keyboard, a mouse, a touchscreen, or a similar device. In some cases, the I/O controller 710 may be implemented as part of a processor, such as the processor 740. In some cases, a user may interact with the device 705 via the I/O controller 710 or via hardware components controlled by the I/O controller 710.

In some cases, the device 705 may include a single antenna 725. However, in some other cases, the device 705 may have more than one antenna 725, which may be capable of concurrently transmitting or receiving multiple wireless transmissions. The transceiver 715 may communicate bi-directionally, via the one or more antennas 725, wired, or wireless links as described herein. For example, the transceiver 715 may represent a wireless transceiver and may communicate bi-directionally with another wireless transceiver. The transceiver 715 may also include a modem to modulate the packets, to provide the modulated packets to one or more antennas 725 for transmission, and to demodulate packets received from the one or more antennas 725. The transceiver 715, or the transceiver 715 and one or more antennas 725, may be an example of a transmitter 415, a transmitter 515, a receiver 410, a receiver 510, or any combination thereof or component thereof, as described herein.

The memory 730 may include random access memory (RAM) and read-only memory (ROM). The memory 730 may store computer-readable, computer-executable code 735 including instructions that, when executed by the processor 740, cause the device 705 to perform various functions described herein. The code 735 may be stored in a non-transitory computer-readable medium such as system memory or another type of memory. In some cases, the code 735 may not be directly executable by the processor 740 but may cause a computer (e.g., when compiled and executed) to perform functions described herein. In some cases, the memory 730 may contain, among other things, a basic I/O system (BIOS) which may control basic hardware or software operation such as the interaction with peripheral components or devices.

The processor 740 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 740 may be configured to operate a memory array using a memory controller. In some other cases, a memory controller may be integrated into the processor 740. The processor 740 may be configured to execute computer-readable instructions stored in a memory (e.g., the memory 730) to cause the device 705 to perform various functions (e.g., functions or tasks supporting dynamic ADC capabilities). For example, the device 705 or a component of the device 705 may include a processor 740 and memory 730 coupled to the processor 740, the processor 740 and memory 730 configured to perform various functions described herein.

For example, the communications manager 720 may be configured as or otherwise support a means for performing a connection establishment procedure with a second wireless device. The communications manager 720 may be configured as or otherwise support a means for identifying, based on performing the connection establishment procedure, a set of ADC resolution sizes supported by the first wireless device, the set of ADC resolution sizes including two or more bit quantities that are dynamically configurable by the first wireless device. The communications manager 720 may be configured as or otherwise support a means for transmitting, to the second wireless device, a capability message that includes an indication of the set of ADC resolution sizes supported by the first wireless device.

By including or configuring the communications manager 720 in accordance with examples as described herein, the device 705 may support techniques for identifying one or more of a UE ADC capability, a set of ADC resolution sizes, an SQNR per ADC resolution size, or a power consumption factor, and transmitting such information to a base station for further optimization. Upon communications over high frequency carriers and large bandwidths (e.g., as utilized in 5G, FR4, FR5, FR6, 6G, or the like), the device 405 may experience inefficient battery use, e.g., as a result of a high ADC resolution size. To mitigate such issues, the device 405 may reconfigure itself with an optimized ADC resolution, which may result in more efficient system performance and communications, more efficient battery use, and a longer battery lifetime.

In some examples, the communications manager 720 may be configured to perform various operations (e.g., receiving, monitoring, transmitting) using or otherwise in cooperation with the transceiver 715, the one or more antennas 725, or any combination thereof. Although the communications manager 720 is illustrated as a separate component, in some examples, one or more functions described with reference to the communications manager 720 may be supported by or performed by the processor 740, the memory 730, the code 735, or any combination thereof. For example, the code 735 may include instructions executable by the processor 740 to cause the device 705 to perform various aspects of dynamic ADC capabilities as described herein, or the processor 740 and the memory 730 may be otherwise configured to perform or support such operations.

Figure 8:
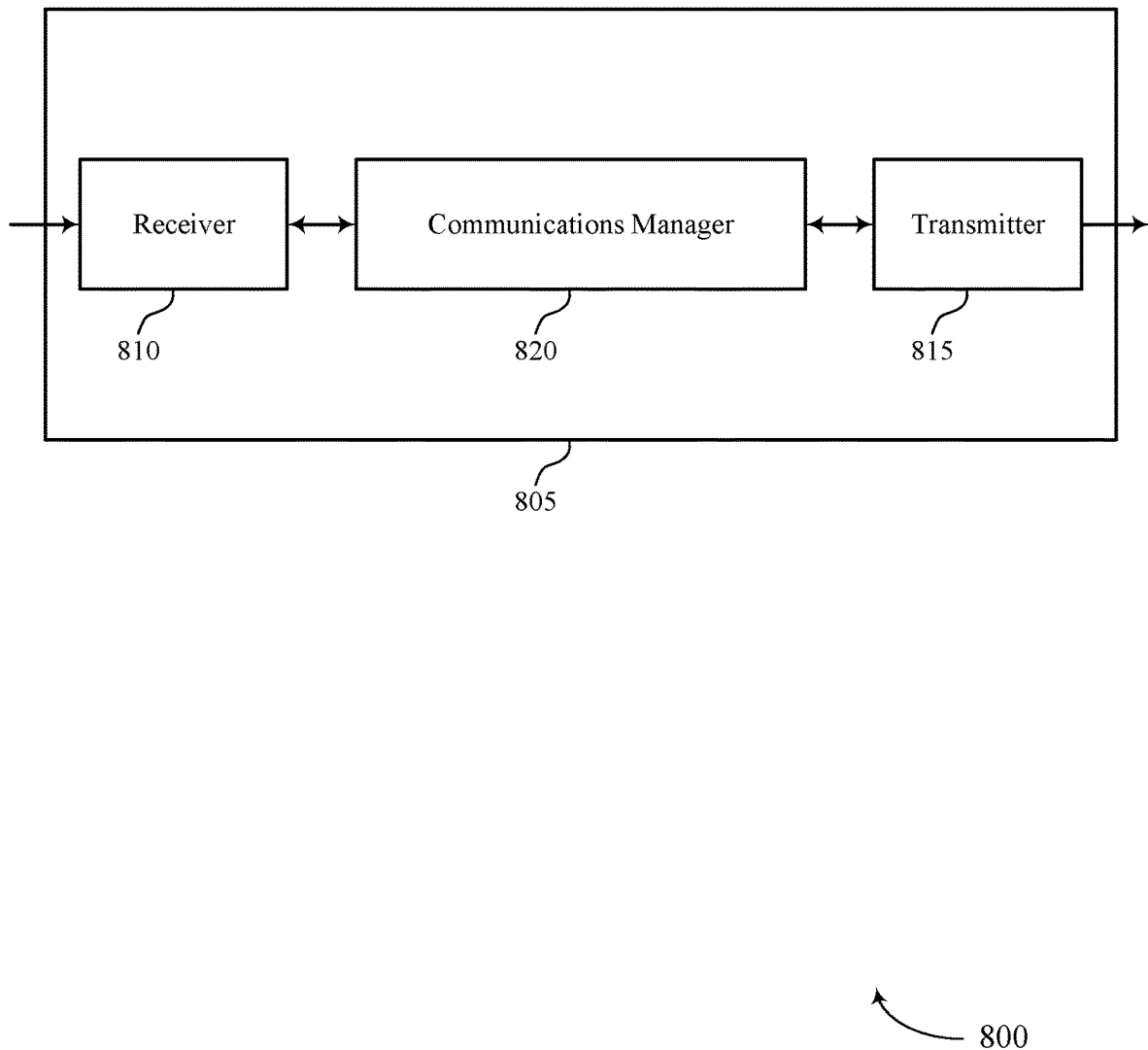
FIGS. 8 and 9 show block diagrams of devices that support dynamic ADC capabilities in accordance with aspects of the present disclosure.

FIG. 8 shows a block diagram 800 of a device 805 that supports dynamic ADC capabilities in accordance with aspects of the present disclosure. The device 805 may be an example of aspects of a base station 105 as described herein. The device 805 may include a receiver 810, a transmitter 815, and a communications manager 820. The device 805 may also include a processor. Each of these components may be in communication with one another (e.g., via one or more buses).

The receiver 810 may provide a means for receiving information such as packets, user data, control information, or any combination thereof associated with various information channels (e.g., control channels, data channels, information channels related to dynamic ADC capabilities). Information may be passed on to other components of the device 805. The receiver 810 may utilize a single antenna or a set of multiple antennas.

The transmitter 815 may provide a means for transmitting signals generated by other components of the device 805. For example, the transmitter 815 may transmit information such as packets, user data, control information, or any combination thereof associated with various information channels (e.g., control channels, data channels, information channels related to dynamic ADC capabilities). In some examples, the transmitter 815 may be co-located with a receiver 810 in a transceiver module. The transmitter 815 may utilize a single antenna or a set of multiple antennas.

The communications manager 820, the receiver 810, the transmitter 815, or various combinations thereof or various components thereof may be examples of means for performing various aspects of dynamic ADC capabilities as described herein. For example, the communications manager 820, the receiver 810, the transmitter 815, or various combinations or components thereof may support a method for performing one or more of the functions described herein.

In some examples, the communications manager 820, the receiver 810, the transmitter 815, or various combinations or components thereof may be implemented in hardware (e.g., in communications management circuitry). The hardware may include a processor, a DSP, an ASIC, an FPGA or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 820, the receiver 810, the transmitter 815, or various combinations or components thereof may be implemented in code (e.g., as communications management software or firmware) executed by a processor. If implemented in code executed by a processor, the functions of the communications manager 820, the receiver 810, the transmitter 815, or various combinations or components thereof may be performed by a general-purpose processor, a DSP, a CPU, an ASIC, an FPGA, or any combination of these or other programmable logic devices (e.g., configured as or otherwise supporting a means for performing the functions described in the present disclosure).

In some examples, the communications manager 820 may be configured to perform various operations (e.g., receiving, monitoring, transmitting) using or otherwise in cooperation with the receiver 810, the transmitter 815, or both. For example, the communications manager 820 may receive information from the receiver 810, send information to the transmitter 815, or be integrated in combination with the receiver 810, the transmitter 815, or both to receive information, transmit information, or perform various other operations as described herein.

The communications manager 820 may support wireless communication at a first wireless device in accordance with examples as disclosed herein. For example, the communications manager 820 may be configured as or otherwise support a means for performing a connection establishment procedure with a second wireless device. The communications manager 820 may be configured as or otherwise support a means for receiving, from the second wireless device and based on the connection establishment procedure, a capability message that includes an indication of a set of ADC resolution sizes supported by the second wireless device, the set of ADC resolution sizes including two or more bit quantities that are dynamically configurable by the second wireless device. The communications manager 820 may be configured as or otherwise support a means for communicating with the second wireless device based on the set of ADC resolution sizes supported by the second wireless device.

By including or configuring the communications manager 820 in accordance with examples as described herein, the device 805 (e.g., a processor controlling or otherwise coupled to the receiver 810, the transmitter 815, the communications manager 820, or a combination thereof) may support techniques for receiving a UE ADC capability message and optimizing the UE ADC resolution therewith. The device 805 may determine an optimal UE ADC resolution for the UE based on one or more of a UE capability, a set of ADC resolution sizes, an SQNR per ADC resolution size, a power consumption factor indication, a UE battery status, a signal throughput, or the like. The device 805 may transmit the optimized ADC resolution to the UE, which may enable the UE to select an appropriate ADC resolution size. Further, the device 805 may, based on the set of ADC resolution sizes, enable clipping of a power amplifier at the device 805 and/or identify precoding parameters associated with the clipping. Thus, the techniques described herein may support optimized UE ADC performance, more reliable communications, and more efficient system performance.

Figure 9:
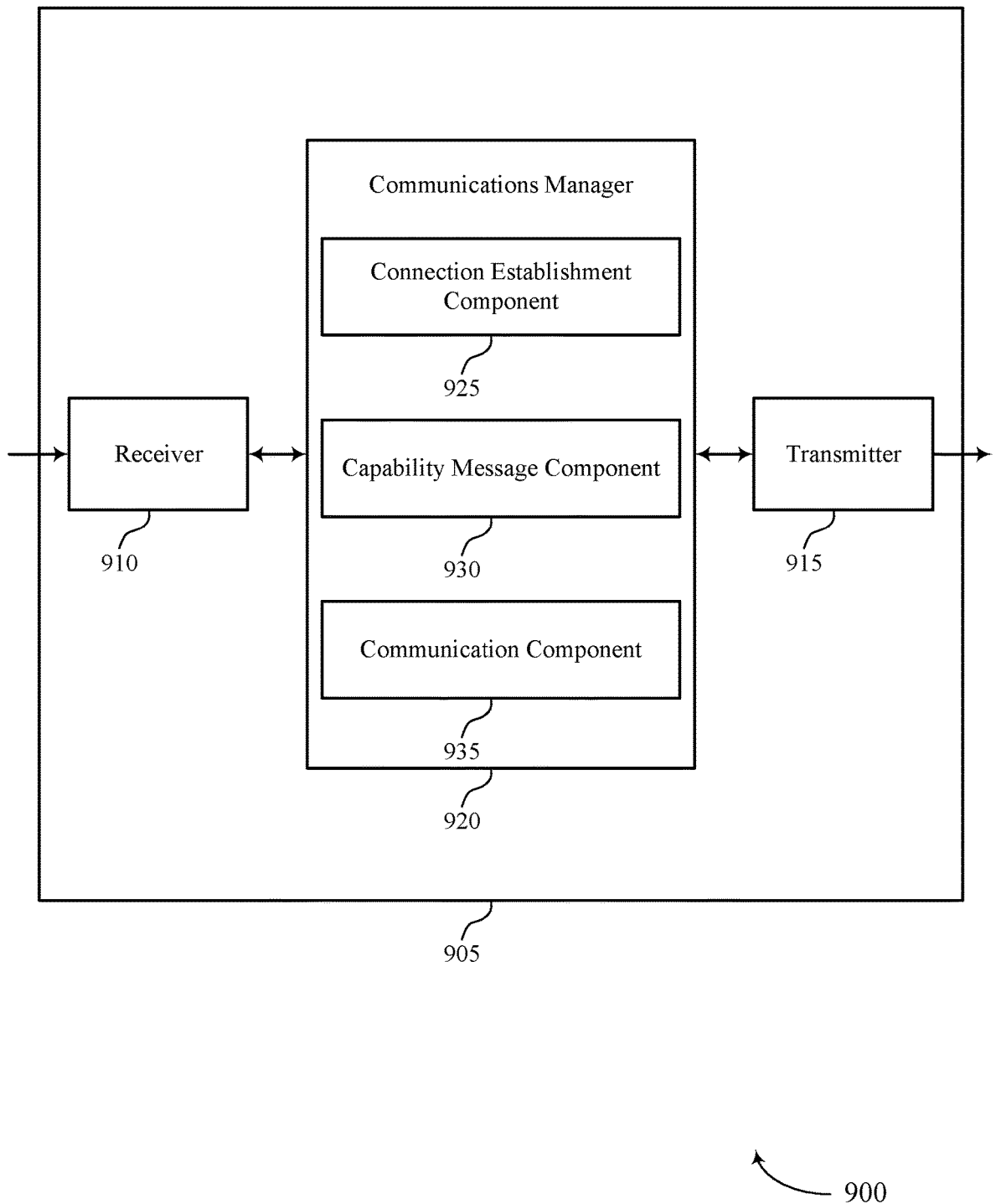

FIG. 9 shows a block diagram 900 of a device 905 that supports dynamic ADC capabilities in accordance with aspects of the present disclosure. The device 905 may be an example of aspects of a device 805 or a base station 105 as described herein. The device 905 may include a receiver 910, a transmitter 915, and a communications manager 920. The device 905 may also include a processor. Each of these components may be in communication with one another (e.g., via one or more buses).

The receiver 910 may provide a means for receiving information such as packets, user data, control information, or any combination thereof associated with various information channels (e.g., control channels, data channels, information channels related to dynamic ADC capabilities). Information may be passed on to other components of the device 905. The receiver 910 may utilize a single antenna or a set of multiple antennas.

The transmitter 915 may provide a means for transmitting signals generated by other components of the device 905. For example, the transmitter 915 may transmit information such as packets, user data, control information, or any combination thereof associated with various information channels (e.g., control channels, data channels, information channels related to dynamic ADC capabilities). In some examples, the transmitter 915 may be co-located with a receiver 910 in a transceiver module. The transmitter 915 may utilize a single antenna or a set of multiple antennas.

The device 905, or various components thereof, may be an example of means for performing various aspects of dynamic ADC capabilities as described herein. For example, the communications manager 920 may include a connection establishment component 925, a capability message component 930, a communication component 935, or any combination thereof. The communications manager 920 may be an example of aspects of a communications manager 820 as described herein. In some examples, the communications manager 920, or various components thereof, may be configured to perform various operations (e.g., receiving, monitoring, transmitting) using or otherwise in cooperation with the receiver 910, the transmitter 915, or both. For example, the communications manager 920 may receive information from the receiver 910, send information to the transmitter 915, or be integrated in combination with the receiver 910, the transmitter 915, or both to receive information, transmit information, or perform various other operations as described herein.

The communications manager 920 may support wireless communication at a first wireless device in accordance with examples as disclosed herein. The connection establishment component 925 may be configured as or otherwise support a means for performing a connection establishment procedure with a second wireless device. The capability message component 930 may be configured as or otherwise support a means for receiving, from the second wireless device and based on the connection establishment procedure, a capability message that includes an indication of a set of ADC resolution sizes supported by the second wireless device, the set of ADC resolution sizes including two or more bit quantities that are dynamically configurable by the second wireless device. The communication component 935 may be configured as or otherwise support a means for communicating with the second wireless device based on the set of ADC resolution sizes supported by the second wireless device.

Figure 10:
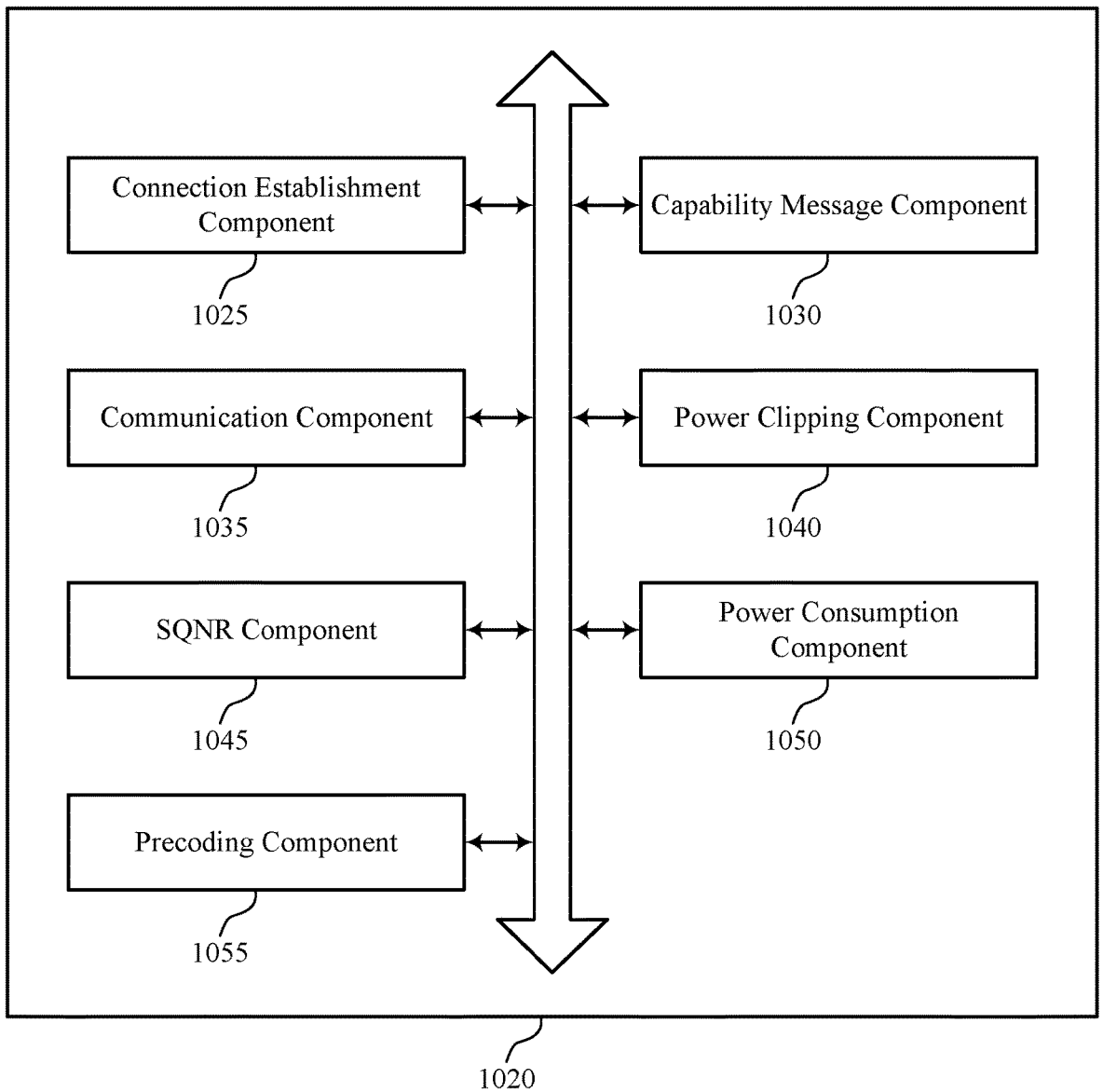
FIG. 10 shows a block diagram of a communications manager that supports dynamic ADC capabilities in accordance with aspects of the present disclosure.

FIG. 10 shows a block diagram 1000 of a communications manager 1020 that supports dynamic ADC capabilities in accordance with aspects of the present disclosure. The communications manager 1020 may be an example of aspects of a communications manager 820, a communications manager 920, or both, as described herein. The communications manager 1020, or various components thereof, may be an example of means for performing various aspects of dynamic ADC capabilities as described herein. For example, the communications manager 1020 may include a connection establishment component 1025, a capability message component 1030, a communication component 1035, a power clipping component 1040, an SQNR component 1045, a power consumption component 1050, a precoding component 1055, or any combination thereof. Each of these components may communicate, directly or indirectly, with one another (e.g., via one or more buses).

The communications manager 1020 may support wireless communication at a first wireless device in accordance with examples as disclosed herein. The connection establishment component 1025 may be configured as or otherwise support a means for performing a connection establishment procedure with a second wireless device. The capability message component 1030 may be configured as or otherwise support a means for receiving, from the second wireless device and based on the connection establishment procedure, a capability message that includes an indication of a set of ADC resolution sizes supported by the second wireless device, the set of ADC resolution sizes including two or more bit quantities that are dynamically configurable by the second wireless device. The communication component 1035 may be configured as or otherwise support a means for communicating with the second wireless device based on the set of ADC resolution sizes supported by the second wireless device.

In some examples, the power clipping component 1040 may be configured as or otherwise support a means for enabling clipping of a power amplifier at the first wireless device based on the set of ADC resolution sizes supported by the second wireless device.

In some examples, the power clipping component 1040 may be configured as or otherwise support a means for identifying one or more precoding parameters associated with the clipping of the power amplifier. In some examples, the precoding component 1055 may be configured as or otherwise support a means for transmitting, to the second wireless device, a message that includes an indication of one or more precoding parameters.

In some examples, the SQNR component 1045 may be configured as or otherwise support a means for identifying, within the capability message, an indication of a table that indicates a signal-to-quantization noise ratio per bit quantity supported by the second wireless device, where communicating with the second wireless device is based on the table.

In some examples, the power consumption component 1050 may be configured as or otherwise support a means for receiving, from the second wireless device, an indication of a power consumption factor associated with each ADC resolution size of the set of ADC resolution sizes.

In some examples, each bit quantity of the two or more bit quantities includes an integer value. In some examples, each bit quantity of the two or more bit quantities includes a positive real number. In some examples, each ADC resolution size of the set of ADC resolution sizes indicates an ENOB for an ADC resolution.

In some examples, the first wireless device includes a base station and the second wireless device includes a UE.

Figure 11:
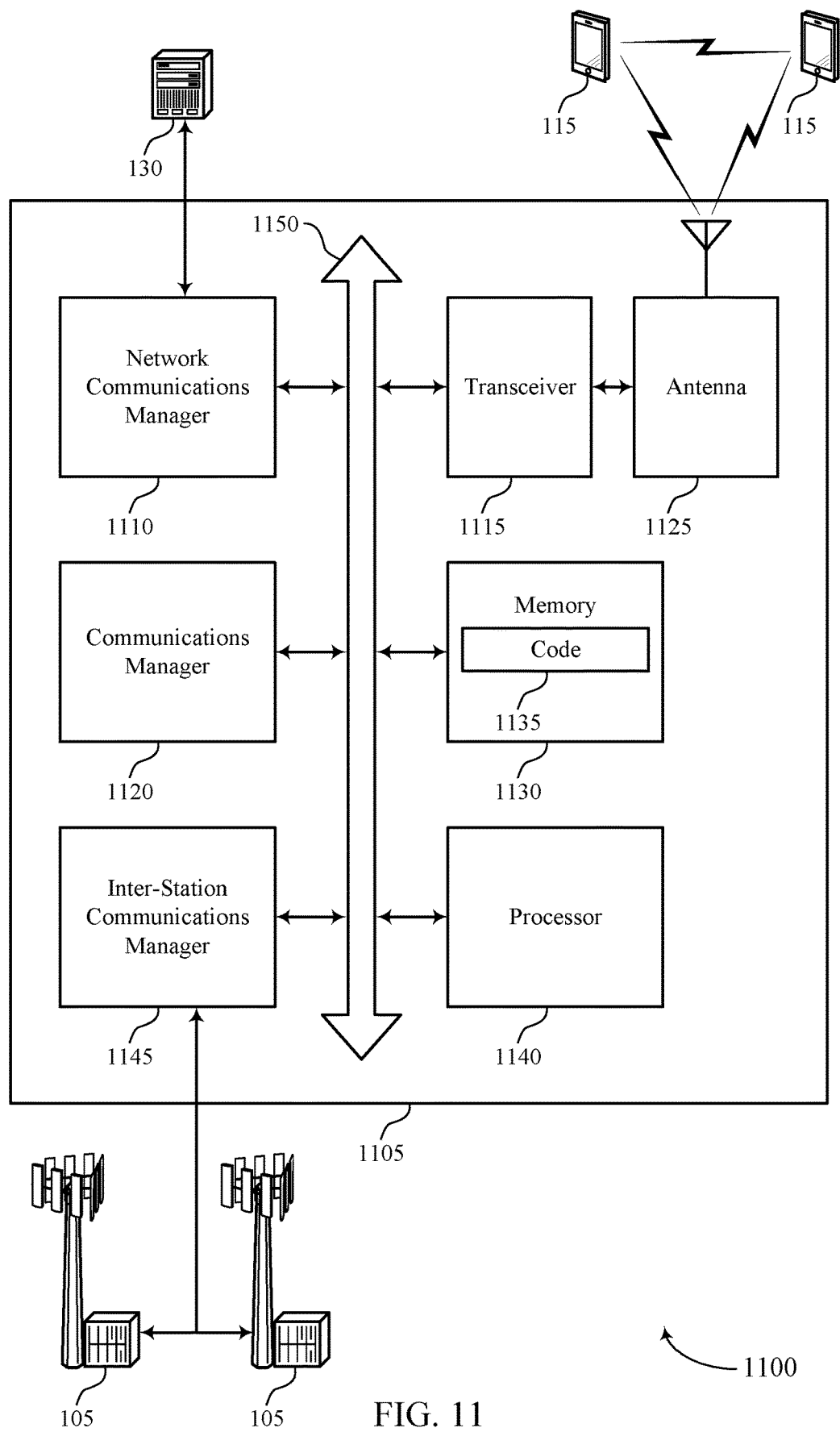
FIG. 11 shows a diagram of a system including a device that supports dynamic ADC capabilities in accordance with aspects of the present disclosure.

FIG. 11 shows a diagram of a system 1100 including a device 1105 that supports dynamic ADC capabilities in accordance with aspects of the present disclosure. The device 1105 may be an example of or include the components of a device 805, a device 905, or a base station 105 as described herein. The device 1105 may communicate wirelessly with one or more base stations 105, UEs 115, or any combination thereof. The device 1105 may include components for bi-directional voice and data communications including components for transmitting and receiving communications, such as a communications manager 1120, a network communications manager 1110, a transceiver 1115, an antenna 1125, a memory 1130, code 1135, a processor 1140, and an inter-station communications manager 1145. These components may be in electronic communication or otherwise coupled (e.g., operatively, communicatively, functionally, electronically, electrically) via one or more buses (e.g., a bus 1150).

The network communications manager 1110 may manage communications with a core network 130 (e.g., via one or more wired backhaul links). For example, the network communications manager 1110 may manage the transfer of data communications for client devices, such as one or more UEs 115.

In some cases, the device 1105 may include a single antenna 1125. However, in some other cases the device 1105 may have more than one antenna 1125, which may be capable of concurrently transmitting or receiving multiple wireless transmissions. The transceiver 1115 may communicate bi-directionally, via the one or more antennas 1125, wired, or wireless links as described herein. For example, the transceiver 1115 may represent a wireless transceiver and may communicate bi-directionally with another wireless transceiver. The transceiver 1115 may also include a modem to modulate the packets, to provide the modulated packets to one or more antennas 1125 for transmission, and to demodulate packets received from the one or more antennas 1125. The transceiver 1115, or the transceiver 1115 and one or more antennas 1125, may be an example of a transmitter 815, a transmitter 915, a receiver 810, a receiver 910, or any combination thereof or component thereof, as described herein.

The memory 1130 may include RAM and ROM. The memory 1130 may store computer-readable, computer-executable code 1135 including instructions that, when executed by the processor 1140, cause the device 1105 to perform various functions described herein. The code 1135 may be stored in a non-transitory computer-readable medium such as system memory or another type of memory. In some cases, the code 1135 may not be directly executable by the processor 1140 but may cause a computer (e.g., when compiled and executed) to perform functions described herein. In some cases, the memory 1130 may contain, among other things, a BIOS which may control basic hardware or software operation such as the interaction with peripheral components or devices.

The processor 1140 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1140 may be configured to operate a memory array using a memory controller. In some other cases, a memory controller may be integrated into the processor 1140. The processor 1140 may be configured to execute computer-readable instructions stored in a memory (e.g., the memory 1130) to cause the device 1105 to perform various functions (e.g., functions or tasks supporting dynamic ADC capabilities). For example, the device 1105 or a component of the device 1105 may include a processor 1140 and memory 1130 coupled to the processor 1140, the processor 1140 and memory 1130 configured to perform various functions described herein.

The inter-station communications manager 1145 may manage communications with other base stations 105, and may include a controller or scheduler for controlling communications with UEs 115 in cooperation with other base stations 105. For example, the inter-station communications manager 1145 may coordinate scheduling for transmissions to UEs 115 for various interference mitigation techniques such as beamforming or joint transmission. In some examples, the inter-station communications manager 1145 may provide an X2 interface within an LTE/LTE-A wireless communications network technology to provide communication between base stations 105.

The communications manager 1120 may support wireless communication at a first wireless device in accordance with examples as disclosed herein. For example, the communications manager 1120 may be configured as or otherwise support a means for performing a connection establishment procedure with a second wireless device. The communications manager 1120 may be configured as or otherwise support a means for receiving, from the second wireless device and based on the connection establishment procedure, a capability message that includes an indication of a set of ADC resolution sizes supported by the second wireless device, the set of ADC resolution sizes including two or more bit quantities that are dynamically configurable by the second wireless device. The communications manager 1120 may be configured as or otherwise support a means for communicating with the second wireless device based on the set of ADC resolution sizes supported by the second wireless device.

By including or configuring the communications manager 1120 in accordance with examples as described herein, the device 1105 may support techniques for receiving a UE ADC capability message and optimizing the UE ADC resolution therewith. The device 1105 may optimize the UE ADC resolution based on one or more of a UE capability, a set of ADC resolutions, a SQNR table, a power consumption factor indication, a UE battery status, a signal throughput, or the like. The device 1105 may transmit the optimized ADC resolution, to the UE, resulting in optimized UE ADC performance, more reliable communications, and more efficient system performance.

In some examples, the communications manager 1120 may be configured to perform various operations (e.g., receiving, monitoring, transmitting) using or otherwise in cooperation with the transceiver 1115, the one or more antennas 1125, or any combination thereof. Although the communications manager 1120 is illustrated as a separate component, in some examples, one or more functions described with reference to the communications manager 1120 may be supported by or performed by the processor 1140, the memory 1130, the code 1135, or any combination thereof. For example, the code 1135 may include instructions executable by the processor 1140 to cause the device 1105 to perform various aspects of dynamic ADC capabilities as described herein, or the processor 1140 and the memory 1130 may be otherwise configured to perform or support such operations.

Figure 12:
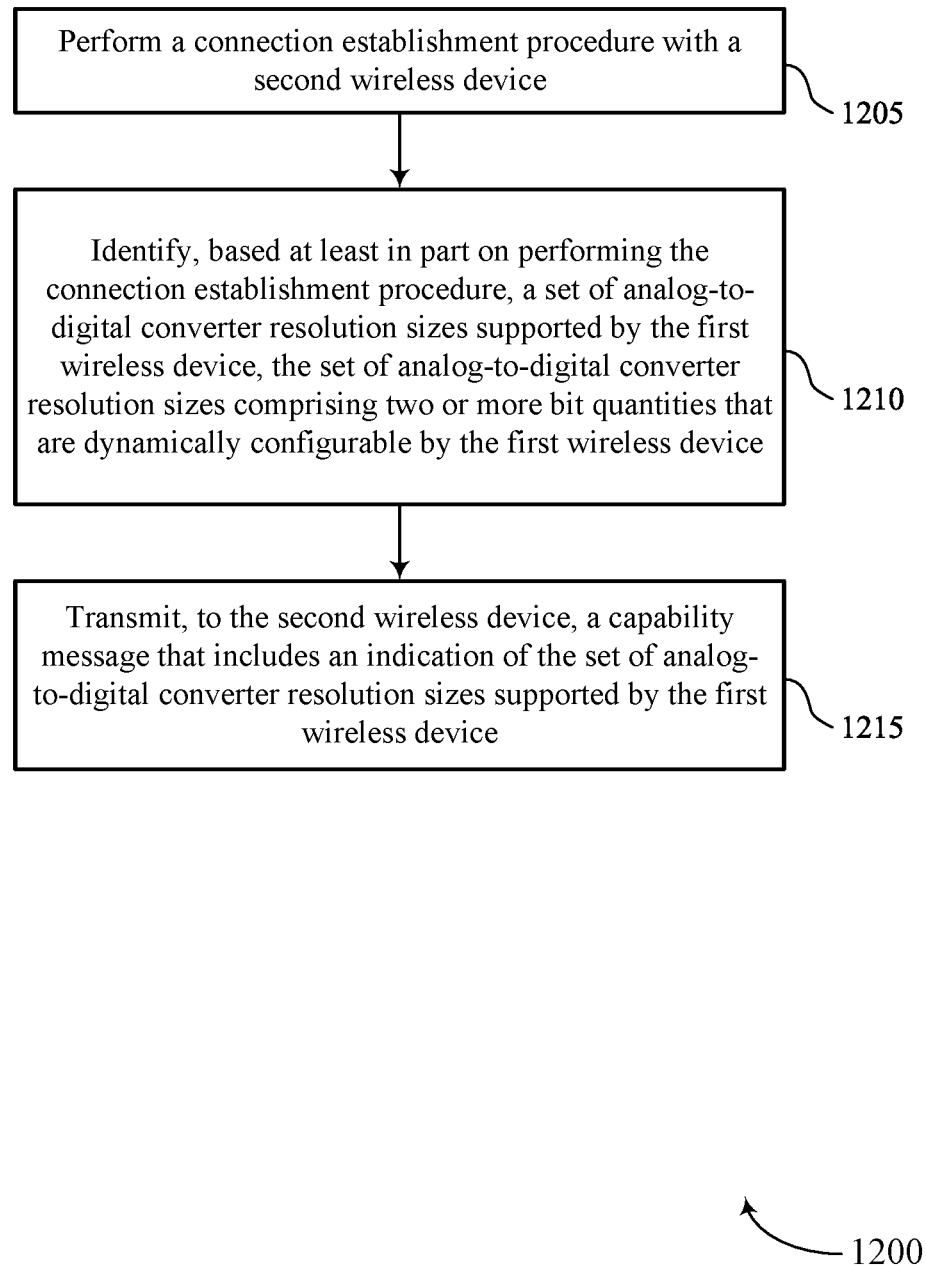
FIGS. 12 through 15 show flowcharts illustrating methods that support dynamic ADC capabilities in accordance with aspects of the present disclosure.

FIG. 12 shows a flowchart illustrating a method 1200 that supports dynamic ADC capabilities in accordance with aspects of the present disclosure. The operations of the method 1200 may be implemented by a first wireless device (e.g., a UE) or its components as described herein. For example, the operations of the method 1200 may be performed by a UE 115 as described with reference to FIGS. 1 through 7. In some examples, a UE may execute a set of instructions to control the functional elements of the UE to perform the described functions. Additionally or alternatively, the UE may perform aspects of the described functions using special-purpose hardware.

At 1205, the method may include performing a connection establishment procedure with a second wireless device. The operations of 1205 may be performed in accordance with examples as disclosed herein. In some examples, aspects of the operations of 1205 may be performed by a connection establishment component 625 as described with reference to FIG. 6.

At 1210, the method may include identifying, based on performing the connection establishment procedure, a set of ADC resolution sizes supported by the first wireless device, the set of ADC resolution sizes including two or more bit quantities that are dynamically configurable by the first wireless device. The operations of 1210 may be performed in accordance with examples as disclosed herein. In some examples, aspects of the operations of 1210 may be performed by a resolution size component 630 as described with reference to FIG. 6.

At 1215, the method may include transmitting, to the second wireless device, a capability message that includes an indication of the set of ADC resolution sizes supported by the first wireless device. The operations of 1215 may be performed in accordance with examples as disclosed herein. In some examples, aspects of the operations of 1215 may be performed by a capability message component 635 as described with reference to FIG. 6.

Figure 13:
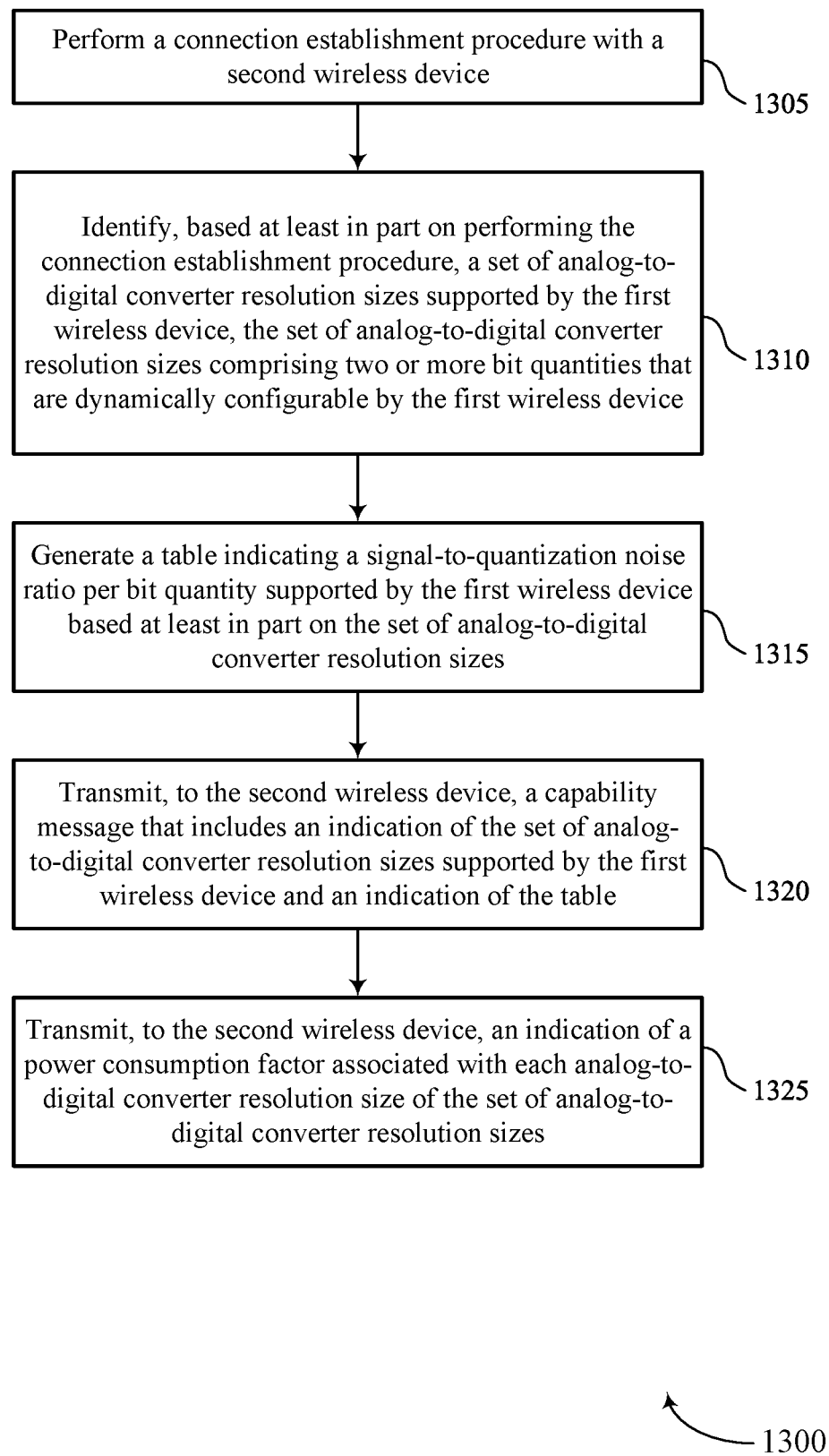

FIG. 13 shows a flowchart illustrating a method 1300 that supports dynamic ADC capabilities in accordance with aspects of the present disclosure. The operations of the method 1300 may be implemented by a first wireless device (e.g., a UE) or its components as described herein. For example, the operations of the method 1300 may be performed by a UE 115 as described with reference to FIGS. 1 through 7. In some examples, a UE may execute a set of instructions to control the functional elements of the UE to perform the described functions. Additionally or alternatively, the UE may perform aspects of the described functions using special-purpose hardware.

At 1305, the method may include performing a connection establishment procedure with a second wireless device. The operations of 1305 may be performed in accordance with examples as disclosed herein. In some examples, aspects of the operations of 1305 may be performed by a connection establishment component 625 as described with reference to FIG. 6.

At 1310, the method may include identifying, based on performing the connection establishment procedure, a set of ADC resolution sizes supported by the first wireless device, the set of ADC resolution sizes including two or more bit quantities that are dynamically configurable by the first wireless device. The operations of 1310 may be performed in accordance with examples as disclosed herein. In some examples, aspects of the operations of 1310 may be performed by a resolution size component 630 as described with reference to FIG. 6.

At 1315, the method may include generating a table indicating a signal-to-quantization noise ratio per bit quantity supported by the first wireless device based on the set of ADC resolution sizes. The operations of 1315 may be performed in accordance with examples as disclosed herein. In some examples, aspects of the operations of 1315 may be performed by an SQNR component 640 as described with reference to FIG. 6.

At 1320, the method may include transmitting, to the second wireless device, a capability message that includes an indication of the set of ADC resolution sizes supported by the first wireless device and an indication of the table. The operations of 1320 may be performed in accordance with examples as disclosed herein. In some examples, aspects of the operations of 1320 may be performed by a capability message component 635 as described with reference to FIG. 6.

At 1325, the method may include transmitting, to the second wireless device, an indication of a power consumption factor associated with each ADC resolution size of the set of ADC resolution sizes. The operations of 1330 may be performed in accordance with examples as disclosed herein. In some examples, aspects of the operations of 1330 may be performed by a power consumption component 645 as described with reference to FIG. 6.

Figure 14:
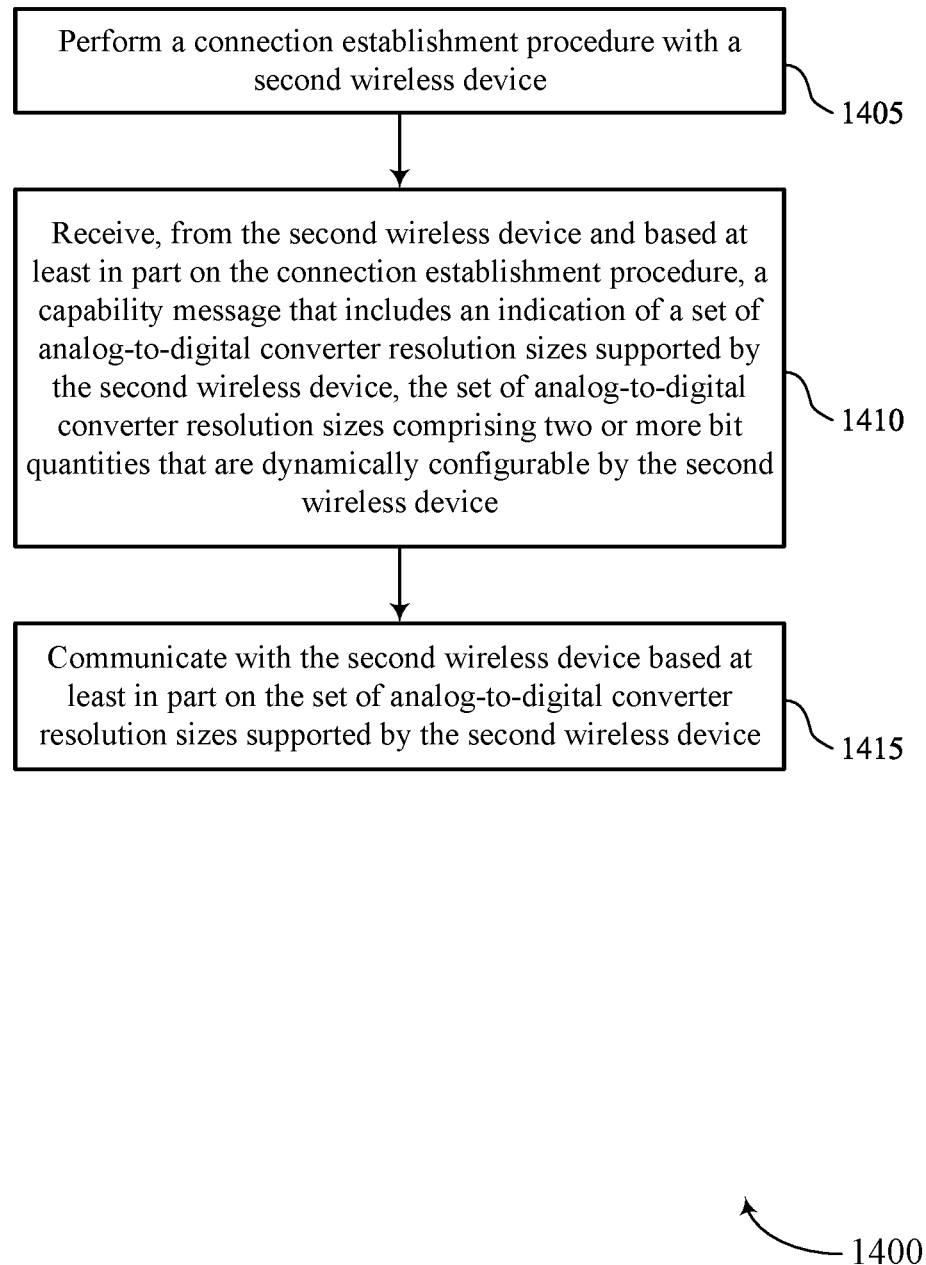

FIG. 14 shows a flowchart illustrating a method 1400 that supports dynamic ADC capabilities in accordance with aspects of the present disclosure. The operations of the method 1400 may be implemented by a first wireless device (e.g., a base station or UE) or its components as described herein. For example, the operations of the method 1400 may be performed by a base station 105 as described with reference to FIGS. 1 through 3 and 8 through 11. In some examples, a base station may execute a set of instructions to control the functional elements of the base station to perform the described functions. Additionally or alternatively, the base station may perform aspects of the described functions using special-purpose hardware.

At 1405, the method may include performing a connection establishment procedure with a second wireless device. The operations of 1405 may be performed in accordance with examples as disclosed herein. In some examples, aspects of the operations of 1405 may be performed by a connection establishment component 1025 as described with reference to FIG. 10.

At 1410, the method may include receiving, from the second wireless device and based on the connection establishment procedure, a capability message that includes an indication of a set of ADC resolution sizes supported by the second wireless device, the set of ADC resolution sizes including two or more bit quantities that are dynamically configurable by the second wireless device. The operations of 1410 may be performed in accordance with examples as disclosed herein. In some examples, aspects of the operations of 1410 may be performed by a capability message component 1030 as described with reference to FIG. 10.

At 1415, the method may include communicating with the second wireless device based on the set of ADC resolution sizes supported by the second wireless device. The operations of 1415 may be performed in accordance with examples as disclosed herein. In some examples, aspects of the operations of 1415 may be performed by a communication component 1035 as described with reference to FIG. 10.

Figure 15:
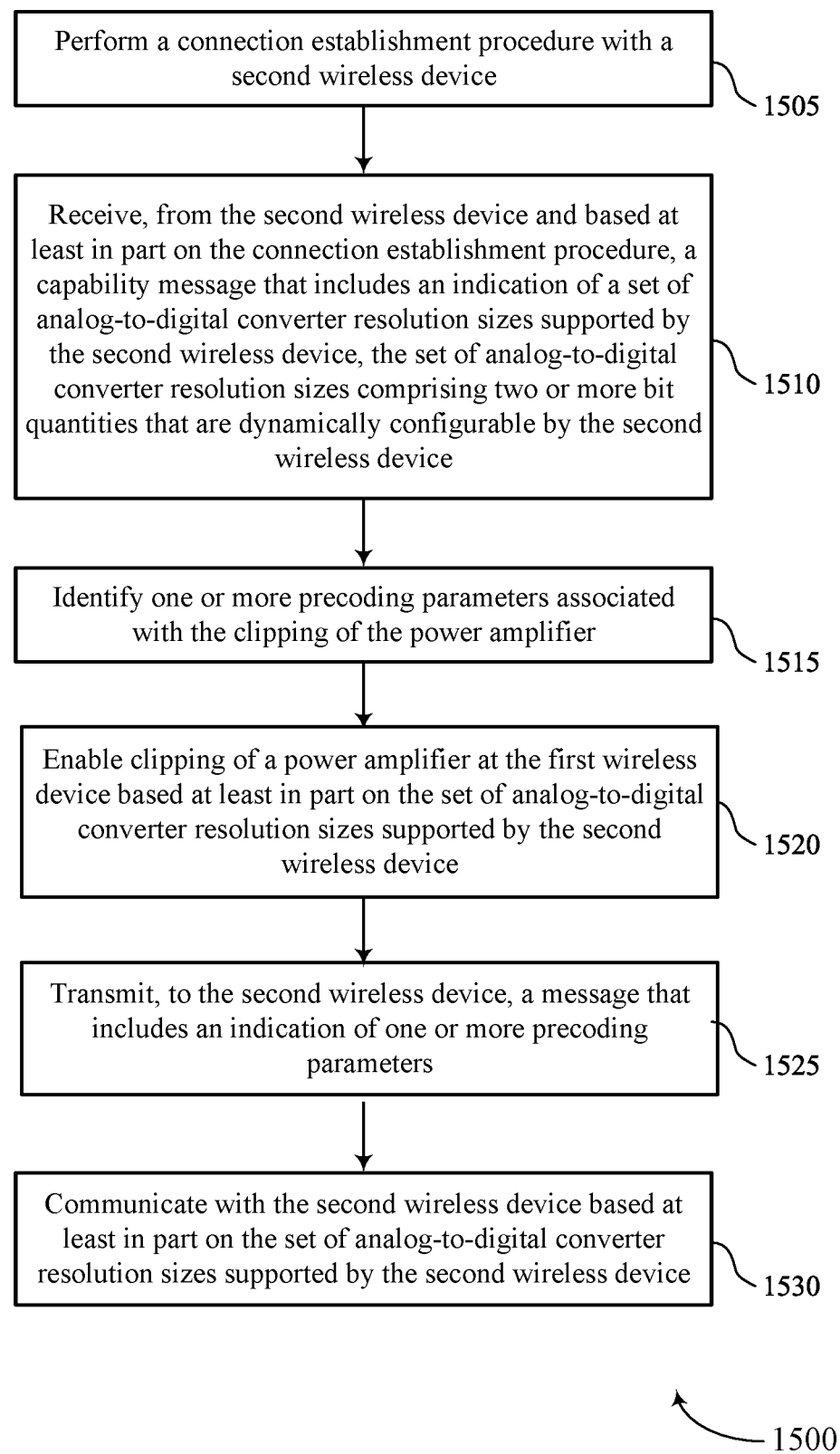

FIG. 15 shows a flowchart illustrating a method 1500 that supports dynamic ADC capabilities in accordance with aspects of the present disclosure. The operations of the method 1500 may be implemented by a first wireless device (e.g., a base station or a UE) or its components as described herein. For example, the operations of the method 1500 may be performed by a base station 105 as described with reference to FIGS. 1 through 3 and 8 through 11. In some examples, a base station may execute a set of instructions to control the functional elements of the base station to perform the described functions. Additionally or alternatively, the base station may perform aspects of the described functions using special-purpose hardware.

At 1505, the method may include performing a connection establishment procedure with a second wireless device. The operations of 1505 may be performed in accordance with examples as disclosed herein. In some examples, aspects of the operations of 1505 may be performed by a connection establishment component 1025 as described with reference to FIG. 10.

At 1510, the method may include receiving, from the second wireless device and based on the connection establishment procedure, a capability message that includes an indication of a set of ADC resolution sizes supported by the second wireless device, the set of ADC resolution sizes including two or more bit quantities that are dynamically configurable by the second wireless device. The operations of 1510 may be performed in accordance with examples as disclosed herein. In some examples, aspects of the operations of 1510 may be performed by a capability message component 1030 as described with reference to FIG. 10.

At 1515, the method may include identifying one or more precoding parameters associated with the clipping of the power amplifier. The operations of 1515 may be performed in accordance with examples as disclosed herein. In some examples, aspects of the operations of 1515 may be performed by a power clipping component 1040 as described with reference to FIG. 10.

At 1520, the method may include enabling clipping of a power amplifier at the first wireless device based on the set of ADC resolution sizes supported by the second wireless device. The operations of 1520 may be performed in accordance with examples as disclosed herein. In some examples, aspects of the operations of 1520 may be performed by a precoding component 1055 as described with reference to FIG. 10.

At 1525, the method may include transmitting, to the second wireless device, a message that includes an indication of one or more precoding parameters. The operations of 1525 may be performed in accordance with examples as disclosed herein. In some examples, aspects of the operations of 1525 may be performed by a power clipping component 1040 as described with reference to FIG. 10.

At 1530, the method may include communicating with the second wireless device based on the set of ADC resolution sizes supported by the second wireless device. The operations of 1530 may be performed in accordance with examples as disclosed herein. In some examples, aspects of the operations of 1530 may be performed by a communication component 1035 as described with reference to FIG. 10.

The following provides an overview of aspects of the present disclosure:

Aspect 1: A method for wireless communication at a first wireless device comprising: performing a connection establishment procedure with a second wireless device; identifying, based at least in part on performing the connection establishment procedure, a set of ADC resolution sizes supported by the first wireless device, the set of ADC resolution sizes comprising two or more bit quantities that are dynamically configurable by the first wireless device; and transmitting, to the second wireless device, a capability message that includes an indication of the set of ADC resolution sizes supported by the first wireless device.

Aspect 2: The method of aspect 1, further comprising: generating a table indicating an SQNR per bit quantity supported by the first wireless device based at least in part on the set of ADC resolution sizes; and transmitting an indication of the table as part of the capability message.

Aspect 3: The method of any of aspects 1 through 2, further comprising: transmitting, to the second wireless device, an indication of a power consumption factor associated with each ADC resolution size of the set of ADC resolution sizes.

Aspect 4: The method of any of aspects 1 through 3, wherein identifying the set of ADC resolution sizes comprises: identifying an integer value corresponding to each bit quantity of the two or more bit quantities, wherein the capability message comprises an indication of the integer values.

Aspect 5: The method of any of aspects 1 through 4, wherein identifying the set of ADC resolution sizes comprises: identifying a positive real number corresponding to each bit quantity of the two or more bit quantities, wherein the capability message comprises an indication of the positive real numbers.

Aspect 6: The method of any of aspects 1 through 5, wherein each ADC resolution size of the set of ADC resolution sizes indicates an effective number of bits for an ADC resolution.

Aspect 7: The method of any of aspects 1 through 6, further comprising: receiving, from the second wireless device, a message indicating one or more precoding parameters that are based at least in part on the set of ADC resolution sizes supported by the first wireless device; and processing a received message based at least in part on the one or more precoding parameters.

Aspect 8: The method of any of aspects 1 through 7, further comprising: receiving one or more messages from the second wireless device; and selecting an ADC resolution size from the set of ADC resolution sizes for processing the one or more messages.

Aspect 9: The method of aspect 8, further comprising: processing the one or more messages using a noise suppression procedure based at least in part on the selected ADC resolution.

Aspect 10: The method of aspect 9, wherein the noise suppression procedure comprises a non-uniform quantization procedure, a nonlinear distortion suppression procedure, a signal reconstruction procedure, or any combination thereof.

Aspect 11: The method of any of aspects 1 through 10, wherein the first wireless device comprises a UE and the second wireless device comprises a base station.

Aspect 12: A method for wireless communication at a first wireless device, comprising: performing a connection establishment procedure with a second wireless device; receiving, from the second wireless device and based at least in part on the connection establishment procedure, a capability message that includes an indication of a set of ADC resolution sizes supported by the second wireless device, the set of ADC resolution sizes comprising two or more bit quantities that are dynamically configurable by the second wireless device; and communicating with the second wireless device based at least in part on the set of ADC resolution sizes supported by the second wireless device.

Aspect 13: The method of aspect 12, further comprising: enabling clipping of a power amplifier at the first wireless device based at least in part on the set of ADC resolution sizes supported by the second wireless device.

Aspect 14: The method of aspect 13, further comprising: identifying one or more precoding parameters associated with the clipping of the power amplifier; and transmitting, to the second wireless device, a message that includes an indication of one or more precoding parameters.

Aspect 15: The method of any of aspects 12 through 14, further comprising: identifying, within the capability message, an indication of a table that indicates an SQNR per bit quantity supported by the second wireless device, wherein communicating with the second wireless device is based at least in part on the table.

Aspect 16: The method of any of aspects 12 through 15, further comprising: receiving, from the second wireless device, an indication of a power consumption factor associated with each ADC resolution size of the set of ADC resolution sizes.

Aspect 17: The method of any of aspects 12 through 16, wherein each bit quantity of the two or more bit quantities comprises an integer value.

Aspect 18: The method of any of aspects 12 through 17, wherein each bit quantity of the two or more bit quantities comprises a positive real number.

Aspect 19: The method of any of aspects 12 through 18, wherein each ADC resolution size of the set of ADC resolution sizes indicates an effective number of bits for an ADC resolution.

Aspect 20: The method of any of aspects 12 through 19, wherein the first wireless device comprises a base station and the second wireless device comprises a UE.

Aspect 21: An apparatus comprising a processor; memory coupled with the processor; and instructions stored in the memory and executable by the processor to cause the apparatus to perform a method of any of aspects 1 through 11.

Aspect 22: An apparatus comprising at least one means for performing a method of any of aspects 1 through 11.

Aspect 23: A non-transitory computer-readable medium storing code the code comprising instructions executable by a processor to perform a method of any of aspects 1 through 11.

Aspect 24: An apparatus for wireless communication at a first wireless device, comprising a processor; memory coupled with the processor; and instructions stored in the memory and executable by the processor to cause the apparatus to perform a method of any of aspects 12 through 20.

Aspect 25: An apparatus for wireless communication at a first wireless device, comprising at least one means for performing a method of any of aspects 12 through 20.

Aspect 26: A non-transitory computer-readable medium storing code for wireless communication at a first wireless device, the code comprising instructions executable by a processor to perform a method of any of aspects 12 through 20.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communication at a first wireless device comprising:
    performing a connection establishment procedure with a second wireless device;
    identifying, based at least in part on performing the connection establishment procedure, a set of analog-to-digital converter resolution sizes supported by an analog-to-digital converter of the first wireless device and for a set of sampling frequencies above a threshold sampling frequency, the set of analog-to-digital converter resolution sizes comprising two or more bit quantities of the analog-to-digital converter that are dynamically configurable by the first wireless device when the analog-to-digital converter operates at a sampling frequency of the set of sampling frequencies;
    generating a table indicating a signal-to-quantization noise ratio per bit quantity supported by the analog-to-digital converter of the first wireless device based at least in part on the set of analog-to-digital converter resolution sizes;
    transmitting, to the second wireless device, a capability message that includes an indication that the first wireless device is capable of dynamically configuring or reconfiguring the set of analog-to-digital converter resolution sizes and an indication of the table, wherein the capability message further indicates the set of analog-to-digital converter resolution sizes that comprise the two or more bit quantities of the analog-to-digital converter that are dynamically configurable by the first wireless device;
    receiving, from the second wireless device, a message indicating one or more precoding parameters that are based at least in part on the set of analog-to-digital converter resolution sizes supported by the analog-to-digital converter of the first wireless device; and
    processing one or more received messages based at least in part on the one or more precoding parameters.

2. The method of claim 1, further comprising:
    transmitting, to the second wireless device, an indication of a power consumption factor associated with each analog-to-digital converter resolution size of the set of analog-to-digital converter resolution sizes.

3. The method of claim 1, wherein identifying the set of analog-to-digital converter resolution sizes comprises:
    identifying an integer value corresponding to each bit quantity of the two or more bit quantities, wherein the capability message comprises an indication of the integer values.

4. The method of claim 1, wherein identifying the set of analog-to-digital converter resolution sizes comprises:
    identifying a positive real number corresponding to each bit quantity of the two or more bit quantities, wherein the capability message comprises an indication of the positive real numbers.

5. The method of claim 1, wherein each analog-to-digital converter resolution size of the set of analog-to-digital converter resolution sizes indicates an effective quantity of bits for an analog-to-digital converter resolution of the analog-to-digital converter.

6. The method of claim 1, further comprising:
    receiving one or more messages from the second wireless device; and
    selecting an analog-to-digital converter resolution size from the set of analog-to-digital converter resolution sizes for processing the one or more messages using the analog-to-digital converter of the first wireless device.

7. The method of claim 6, further comprising:
    processing the one or more messages using a noise suppression procedure based at least in part on the selected analog-to-digital converter resolution.

8. The method of claim 7, wherein the noise suppression procedure comprises a non-uniform quantization procedure, a nonlinear distortion suppression procedure, a signal reconstruction procedure, or any combination thereof.

9. The method of claim 1, wherein the first wireless device comprises a user equipment (UE) and the second wireless device comprises a network device.

10. An apparatus for wireless communication at a first wireless device, comprising:
    a processor;
    memory coupled with the processor; and
    instructions stored in the memory and executable by the processor to cause the apparatus to:

perform a connection establishment procedure with a second wireless device;

identify, based at least in part on performing the connection establishment procedure, a set of analog-to-digital converter resolution sizes supported by an analog-to-digital converter of the first wireless device and for a set of sampling frequencies above a threshold sampling frequency, the set of analog-to-digital converter resolution sizes comprising two or more bit quantities of the analog-to-digital converter that are dynamically configurable by the first wireless device when the analog-to-digital converter operates at a sampling frequency of the set of sampling frequencies;

generate a table indicating a signal-to-quantization noise ratio per bit quantity supported by the analog-to-digital converter of the first wireless device based at least in part on the set of analog-to-digital converter resolution sizes;

transmit, to the second wireless device, a capability message that includes an indication that the first wireless device is capable of dynamically configuring or reconfiguring the set of analog-to-digital converter resolution sizes and an indication of the table, wherein the capability message further indicates the set of analog-to-digital converter resolution sizes that comprise the two or more bit quantities of the analog-to-digital converter that are dynamically configurable by the first wireless device;

receive, from the second wireless device, a message indicating one or more precoding parameters that are based at least in part on the set of analog-to-digital converter resolution sizes supported by the analog-to-digital converter of the first wireless device; and process one or more received messages based at least in part on the one or more precoding parameters.

11. The apparatus of claim 10, wherein the instructions are further executable by the processor to cause the apparatus to:
transmit, to the second wireless device, an indication of a power consumption factor associated with each analog-to-digital converter resolution size of the set of analog-to-digital converter resolution sizes.

12. The apparatus of claim 10, wherein the instructions to identify the set of analog-to-digital converter resolution sizes are executable by the processor to cause the apparatus to:
identify an integer value corresponding to each bit quantity of the two or more bit quantities, wherein the capability message comprises an indication of the integer values.

13. The apparatus of claim 10, wherein the instructions to identify the set of analog-to-digital converter resolution sizes are executable by the processor to cause the apparatus to:
identify a positive real number corresponding to each bit quantity of the two or more bit quantities, wherein the capability message comprises an indication of the positive real numbers.

14. The apparatus of claim 10, wherein each analog-to-digital converter resolution size of the set of analog-to-digital converter resolution sizes indicates an effective quantity of bits for an analog-to-digital converter resolution of the analog-to-digital converter.

15. An apparatus for wireless communication at a first wireless device, comprising:
means for performing a connection establishment procedure with a second wireless device;

means for identifying, based at least in part on performing the connection establishment procedure, a set of analog-to-digital converter resolution sizes supported by an analog-to-digital converter of the first wireless device and for a set of sampling frequencies above a threshold sampling frequency, the set of analog-to-digital converter resolution sizes comprising two or more bit quantities of the analog-to-digital converter that are dynamically configurable by the first wireless device when the analog-to-digital converter operates at a sampling frequency of the set of sampling frequencies;

means for generating a table indicating a signal-to-quantization noise ratio per bit quantity supported by the analog-to-digital converter of the first wireless device based at least in part on the set of analog-to-digital converter resolution sizes;

means for transmitting, to the second wireless device, a capability message that includes an indication that the first wireless device is capable of dynamically configuring or reconfiguring the set of analog-to-digital converter resolution sizes and an indication of the table, wherein the capability message further indicates the set of analog-to-digital converter resolution sizes that comprise the two or more bit quantities of the analog-to-digital converter that are dynamically configurable by the first wireless device;

means for receiving, from the second wireless device, a message indicating one or more precoding parameters that are based at least in part on the set of analog-to-digital converter resolution sizes supported by the analog-to-digital converter of the first wireless device; and means for processing one or more received messages based at least in part on the one or more precoding parameters.

16. The apparatus of claim 15, further comprising:
means for transmitting, to the second wireless device, an indication of a power consumption factor associated with each analog-to-digital converter resolution size of the set of analog-to-digital converter resolution sizes.

17. The apparatus of claim 15, wherein the means for identifying the set of analog-to-digital converter resolution sizes comprise:
means for identifying an integer value corresponding to each bit quantity of the two or more bit quantities, wherein the capability message comprises an indication of the integer values.

18. The apparatus of claim 15, wherein the means for identifying the set of analog-to-digital converter resolution sizes comprise:
means for identifying a positive real number corresponding to each bit quantity of the two or more bit quantities, wherein the capability message comprises an indication of the positive real numbers.

19. The apparatus of claim 15, wherein each analog-to-digital converter resolution size of the set of analog-to-digital converter resolution sizes indicates an effective quantity of bits for an analog-to-digital converter resolution of the analog-to-digital converter.

20. The apparatus of claim 15, further comprising:
means for receiving one or more messages from the second wireless device; and
means for selecting an analog-to-digital converter resolution size from the set of analog-to-digital converter resolution sizes for processing the one or more messages using the analog-to-digital converter of the first wireless device.

21. The apparatus of claim 20, further comprising:
means for processing the one or more messages using a noise suppression procedure based at least in part on the selected analog-to-digital converter resolution.

22. The apparatus of claim 21, wherein the noise suppression procedure comprises a non-uniform quantization procedure, a nonlinear distortion suppression procedure, a signal reconstruction procedure, or any combination thereof.

23. The apparatus of claim 15, wherein the first wireless device comprises a user equipment (UE) and the second wireless device comprises a network device.

24. A non-transitory computer-readable medium storing code for wireless communication at a first wireless device, the code comprising instructions executable by a processor to:
perform a connection establishment procedure with a second wireless device;
identify, based at least in part on performing the connection establishment procedure, a set of analog-to-digital converter resolution sizes supported by an analog-to-digital converter of the first wireless device and for a set of sampling frequencies above a threshold sampling frequency, the set of analog-to-digital converter resolution sizes comprising two or more bit quantities of the analog-to-digital converter that are dynamically configurable by the first wireless device when the analog-to-digital converter operates at a sampling frequency of the set of sampling frequencies;
generate a table indicating a signal-to-quantization noise ratio per bit quantity supported by the analog-to-digital converter of the first wireless device based at least in part on the set of analog-to-digital converter resolution sizes;
transmit, to the second wireless device, a capability message that includes an indication that the first wireless device is capable of dynamically configuring or reconfiguring the set of analog-to-digital converter resolution sizes and an indication of the table, wherein the capability message further indicates the set of analog-to-digital converter resolution sizes that comprise the two or more bit quantities of the analog-to-digital converter that are dynamically configurable by the first wireless device;
receive, from the second wireless device, a message indicating one or more precoding parameters that are based at least in part on the set of analog-to-digital converter resolution sizes supported by the analog-to-digital converter of the first wireless device; and
process one or more received messages based at least in part on the one or more precoding parameters.

* * * * *